United States Patent
Lewis et al.

(10) Patent No.: US 8,103,975 B2
(45) Date of Patent: Jan. 24, 2012

(54) APPARATUS AND METHODS FOR OPTIMIZING THE PERFORMANCE OF PROGRAMMABLE LOGIC DEVICES USING MULTIPLE SUPPLY VOLTAGE

(75) Inventors: David Lewis, Toronto (CA); Vaughn Betz, Toronto (CA); Paul Leventis, Toronto (CA); Christopher Lane, San Jose, CA (US); Andy Lee, San Jose, CA (US); Jeffrey Watt, Palo Alto, CA (US); Timothy Vanderhoek, Toronto (CA)

(73) Assignee: Altera Corporation, San Jose, CA (US)

( * ) Notice: Subject to any disclaimer, the term of this patent is extended or adjusted under 35 U.S.C. 154(b) by 393 days.

(21) Appl. No.: 12/165,664

(22) Filed: Jul. 1, 2008

(65) Prior Publication Data

US 2008/0263490 A1  Oct. 23, 2008

Related U.S. Application Data

(62) Division of application No. 11/204,570, filed on Aug. 16, 2005, now Pat. No. 7,400,167.

(51) Int. Cl.
*G06F 17/50* (2006.01)
(52) U.S. Cl. .......... 716/6; 716/4; 716/5; 326/38; 326/39
(58) Field of Classification Search .................. 716/4–6, 716/113, 121, 128; 326/38–39
See application file for complete search history.

(56) References Cited

U.S. PATENT DOCUMENTS

| | | | |
|---|---|---|---|
| 5,774,367 A | 6/1998 | Reyes et al. | |
| 5,940,334 A | 8/1999 | Holst | |
| 6,108,804 A | 8/2000 | Derner | |
| 6,147,539 A | 11/2000 | Almulla | |
| 6,175,952 B1 * | 1/2001 | Patel et al. | ............ 716/18 |
| 6,324,426 B1 | 11/2001 | Thompson | |
| 6,335,650 B1 | 1/2002 | Boerstler et al. | |
| 6,384,628 B1 | 5/2002 | Lacey et al. | |
| 6,384,674 B2 | 5/2002 | Tanizaki et al. | |
| 6,429,726 B1 | 8/2002 | Bruneau et al. | |
| 6,621,325 B2 * | 9/2003 | Hart et al. | ............ 327/534 |
| 6,710,621 B2 | 3/2004 | Devlin et al. | |

(Continued)

FOREIGN PATENT DOCUMENTS

EP  1233328 A2  2/2002

(Continued)

OTHER PUBLICATIONS

Ernst et al., "Razor: A Low-Power Pipeline Based on Circuit-Level Timing Speculation," 36th Annual International Symposium on Microarchitecture (MICRO-36), Dec. 2003, 12 pp.

(Continued)

*Primary Examiner* — Naum B Levin
(74) *Attorney, Agent, or Firm* — Law Offices of Maximilian R. Peterson

(57) ABSTRACT

A programmable logic device (PLD) includes first and second circuits. The first and second circuits are part of a user's design to be implemented using the PLD's resources. The first circuit is powered by a first supply voltage. The second circuit is powered by a second supply voltage. At least one of the first and second supply voltages is determined by a PLD computer-aided design (CAD) flow used to implement the user's design in the PLD.

9 Claims, 18 Drawing Sheets

U.S. PATENT DOCUMENTS

| | | | |
|---|---|---|---|
| 6,768,335 | B1 | 7/2004 | Young et al. |
| 6,768,338 | B1 | 7/2004 | Young et al. |
| 6,792,582 | B1 * | 9/2004 | Cohn et al. ............... 716/7 |
| 7,080,341 | B2 * | 7/2006 | Eisenstadt et al. ........ 716/13 |
| 7,089,510 | B2 * | 8/2006 | Correale, Jr. et al. ..... 716/133 |
| 7,098,689 | B1 | 8/2006 | Tuan et al. |
| 7,111,266 | B2 * | 9/2006 | Correale et al. ............ 716/10 |
| 7,112,997 | B1 * | 9/2006 | Liang et al. ................ 326/81 |
| 7,129,745 | B2 * | 10/2006 | Lewis et al. ................ 326/38 |
| 7,142,009 | B1 * | 11/2006 | Watt et al. .................. 326/38 |
| 7,210,115 | B1 * | 4/2007 | Rahim et al. ............... 716/16 |
| 7,348,827 | B2 * | 3/2008 | Rahim et al. ............... 327/534 |
| 7,498,836 | B1 * | 3/2009 | Tuan ........................... 326/38 |
| 7,714,610 | B2 * | 5/2010 | He ............................. 326/41 |
| 2001/0035773 | A1 | 11/2001 | McClintock et al. |
| 2001/0048319 | A1 | 12/2001 | Miyazaki et al. |
| 2002/0097628 | A1 | 7/2002 | Fujisawa et al. |
| 2003/0202390 | A1 | 10/2003 | Narui et al. |
| 2004/0060024 | A1 * | 3/2004 | Bednar et al. ............... 716/7 |
| 2005/0091629 | A1 * | 4/2005 | Eisenstadt et al. ........ 716/13 |
| 2005/0258862 | A1 * | 11/2005 | Rahim et al. ............... 326/38 |
| 2005/0280437 | A1 * | 12/2005 | Lewis et al. ................ 326/38 |
| 2006/0119382 | A1 * | 6/2006 | Shumarayev et al. ...... 326/33 |
| 2006/0202714 | A1 * | 9/2006 | Hoang et al. ............... 326/38 |
| 2007/0164785 | A1 * | 7/2007 | He ............................. 326/41 |
| 2009/0031155 | A1 | 1/2009 | Hofmann et al. |

FOREIGN PATENT DOCUMENTS

| | | |
|---|---|---|
| WO | WO9712444 | 9/1996 |

OTHER PUBLICATIONS

Lin et al., "Optimal Voltage Assignment Approach for Low Power Using ILP," WSEAS Transactions on Circuits and Systems, Jul. 2008, pp. 728-737.

Search report for application 06016941.4-1233/1755223, foreign counterpart of parent application, Sep. 4, 2009, 5 pp.

Lasbouygues et al., Temperature and Voltage Aware Timing Analysis: Application to Voltage Drops, 2007 EDAA, 6 pp.

Search report for application 06016941.4-1233/1755223, foreign counterpart of parent application, Jan. 14, 2010, 16 pp.

Ingrid Kohl, "TLC770X Series of BiCMOS Supply Voltage Supervisors," Texas Instruments publication, Apr. 1995, 27 pp.

Kouroussis et al., "Voltage-Aware Timing Analysis," IEEE Transactions on Comoputer-Aided Design of Integrated Circuits and Systems, vol. 25, No. 10, Oct. 2006, pp. 2156-2169.

* cited by examiner

APPARATUS AND METHODS FOR OPTIMIZING THE PERFORMANCE OF PROGRAMMABLE LOGIC DEVICES USING MULTIPLE SUPPLY VOLTAGE

CROSS-REFERENCE TO RELATED APPLICATIONS

This application is a divisional of application Ser. No. 11/204,570, filed on Aug. 16, 2005, titled 'Apparatus and Methods for Optimizing the Performance of Programmable Logic Devices,' now U.S. Pat. No. 7,400,167, which is hereby incorporated by reference in its entirety.

TECHNICAL FIELD

The inventive concepts relate generally to optimizing the performance of programmable logic devices (PLDs). More particularly, the invention concerns optimizing power consumption and obtaining an optimal level of power consumption and speed of operation of PLDs.

BACKGROUND

Modern PLDs have increased, and continue to increase, in complexity. Typical PLDs contain several tens of millions of transistors. On the one hand, the increased complexity of the PLDs has resulted in improved performance levels and increased flexibility. On the other hand, PLDs' complexity and the large number of transistors has resulted in increased power consumption in the device. As device dimensions decrease below 0.1 micron, power becomes a more critical concern. This trend will likely continue, as the complexity of PLDs increases.

One method of addressing power consumption is to reduce the supply voltage of the chip, but this technique is less attractive in a PLD because the threshold drop of the n-type metal oxide semiconductor (NMOS) pass transistors causes a relatively serious degradation in speed. It is possible to overcome this limitation by boosting the gate voltage on the pass transistors, but doing so may cost extra processing steps to provide an extra oxide thickness, as well as possibly require a charge pump to supply the extra current. A need therefore exists for optimizing power consumption of PLDs for desired performance characteristics.

SUMMARY

The disclosed novel concepts relate to apparatus and methods for optimizing power consumption in PLDs. More specifically, the inventive concepts provide solutions aimed at the increasing or excessive power consumption levels in PLDs. In one embodiment, a PLD includes a pair of circuits in a user's design to be implemented using the PLD's resources. The circuits are powered by two supply voltages. More specifically, one circuit in the user's design is configured to be powered by one supply voltage, whereas the second circuit is configured to be powered by a second supply voltage. At least one of the supply voltages is determined by a PLD computer-aided design (CAD) flow used to implement the user's design in the PLD.

In another embodiment, a PLD includes a pair of circuits in a user's design to be implemented using the PLD's resources. The circuits are powered by two supply voltages. More specifically, one circuit in the user's design is configured to be powered by one supply voltage, whereas the second circuit is configured to be powered by a second supply voltage. The supply voltages are different from one another (one supply voltage is lower than the other supply voltage).

Another aspect of the invention relates to methods of optimizing or reducing power consumption in PLDs. In one embodiment, a method of implementing an electronic circuit by using resources within a PLD powered by two supply voltages includes assigning a nominal level to the one of the supply voltages, say, the second supply voltage. The method also includes performing place and route of the resources within the PLD used to implement the electronic circuit, and determining a value of the second supply voltage level that meets a timing specification of the electronic circuit.

In another embodiment, a method of implementing an electronic circuit by using resources within a PLD powered by two supply voltages includes assigning a nominal level to the one of the supply voltages, say, the second supply voltage. The method also includes performing a placement of the resources within the PLD, optimizing the placement by using delay estimates that correspond to the second supply voltage level, and determining a value of the second supply voltage level that meets a timing specification of the electronic circuit.

BRIEF DESCRIPTION OF THE DRAWINGS

The appended drawings illustrate only exemplary embodiments of the invention and therefore should not be considered or construed as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for optimizing the performance of PLDs, including optimizing power consumption within PLDs. One feature of the inventive concepts relates to PLDs include structures that provide a configurable power supply voltage for routing drivers and logic, while retaining a higher voltage on pass transistor gates.

Another feature of the inventive concepts relates to computer-aided design (CAD) flows determine and optimize (or tend to optimize) the voltage that minimizes (or tends to minimize) power consumption. The architecture and CAD flows also combine effectively with selective speed/power control or trade-off for regions in the PLD for further power consumption reduction. The inventive concepts also include methods for determining appropriate values of supply voltage and assigning speed/power configurations to configurable regions on the PLD.

Figure 1:
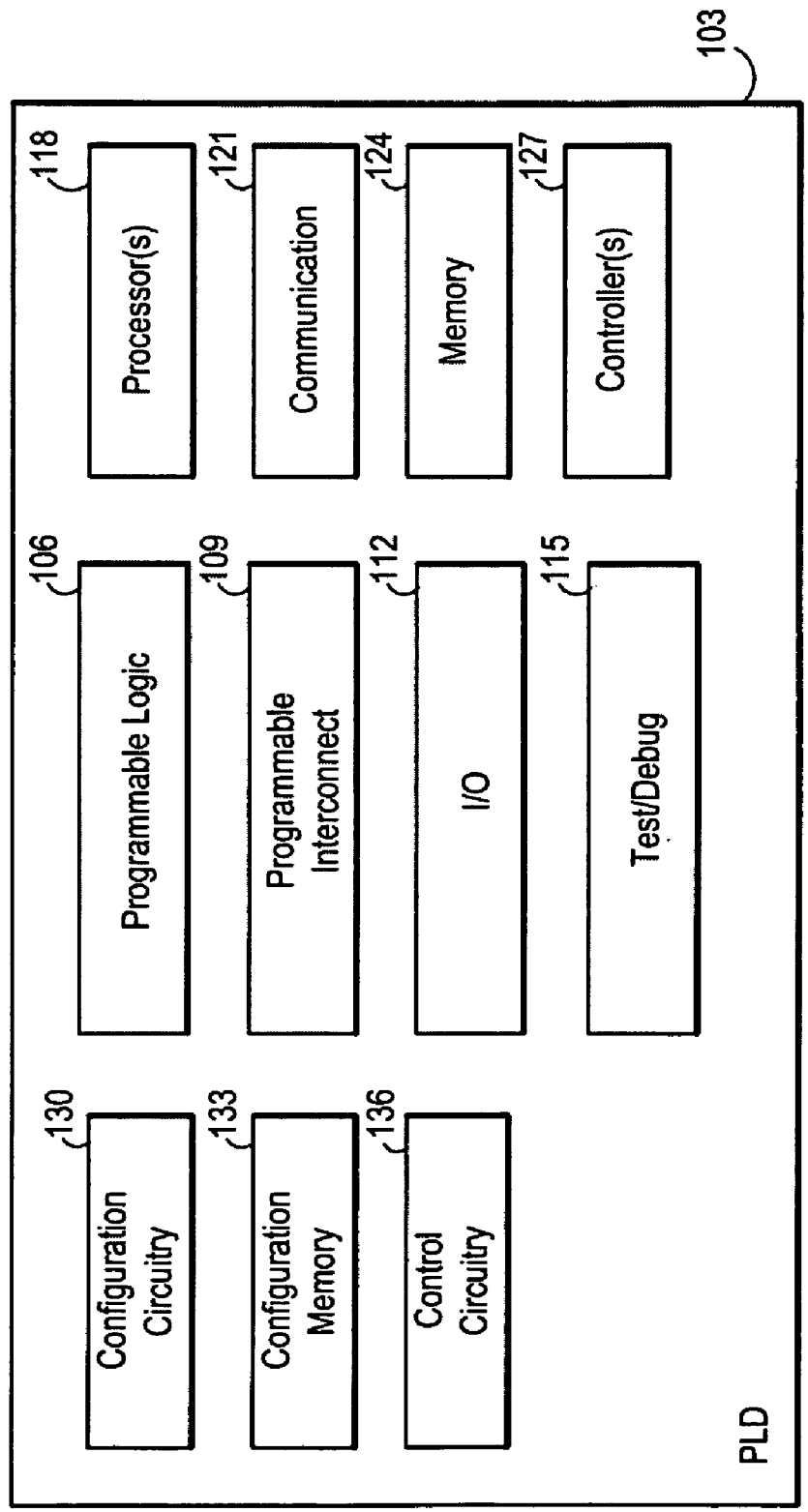
FIG. 1 shows a general block diagram of a PLD according to an illustrative embodiment of the invention.

FIG. 1 shows a general block diagram of a PLD 103 according to an illustrative embodiment of the invention. PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 133. The contents of CRAM 133 determine the functionality of various blocks of PLD 103, such as programmable logic 106 and programmable interconnect 109.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 2:
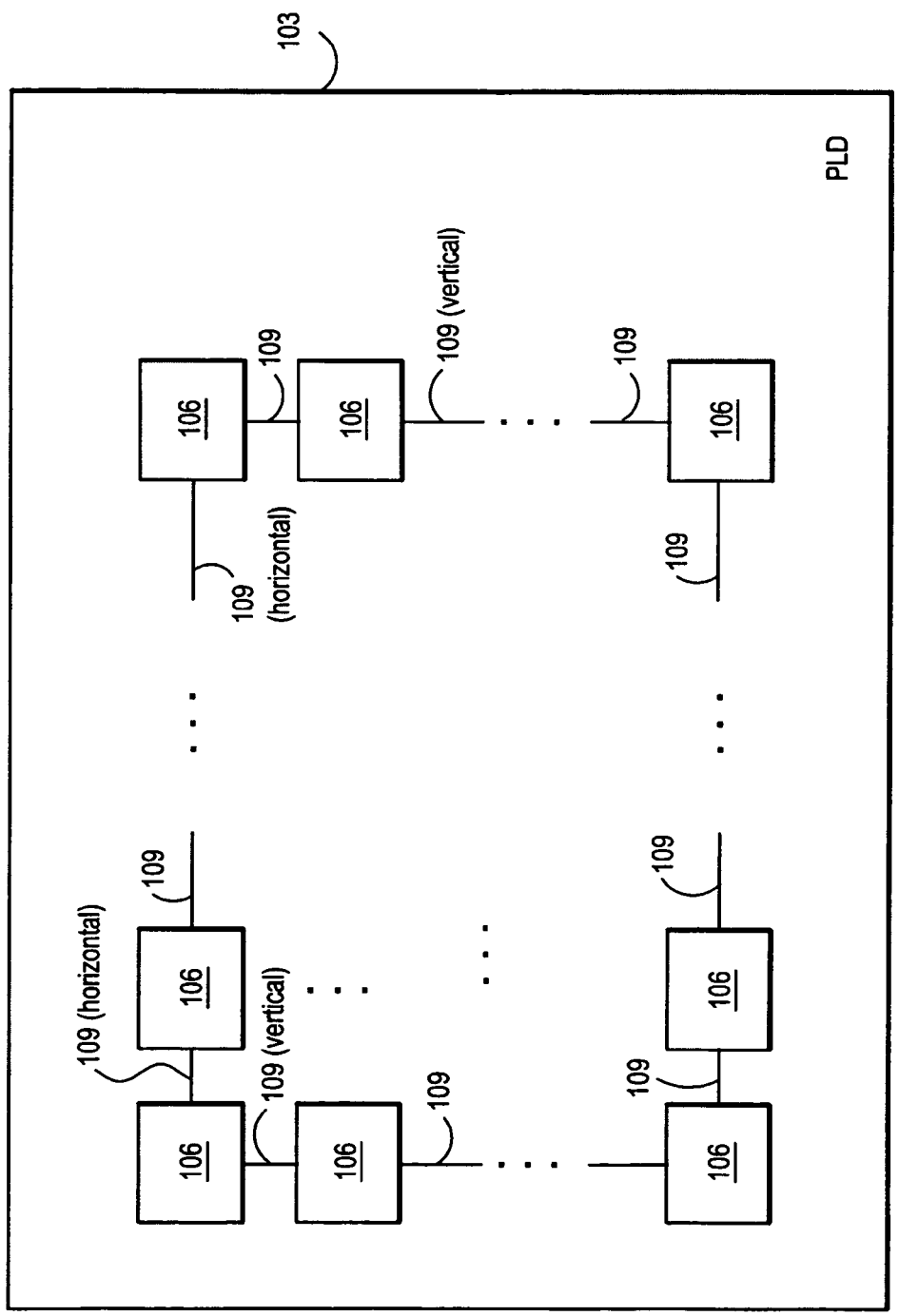
FIG. 2 illustrates a floor-plan of a PLD according to an exemplary embodiment of the invention.

FIG. 2 shows a floor-plan of a PLD 103 according to an exemplary embodiment of the invention. PLD 103 includes programmable logic 106 arranged as a two-dimensional array. Programmable interconnect 109, arranged as horizontal interconnect and vertical interconnect, couples the blocks of programmable logic 106 to one another. One may adjust the power supply voltage of the various blocks in PLD 103, as described below in detail. In illustrative embodiments, PLDs according to the invention have a hierarchical architecture. In other words, each block of programmable logic 106 may in turn include smaller or more granular programmable logic blocks or circuits.

Figure 3:
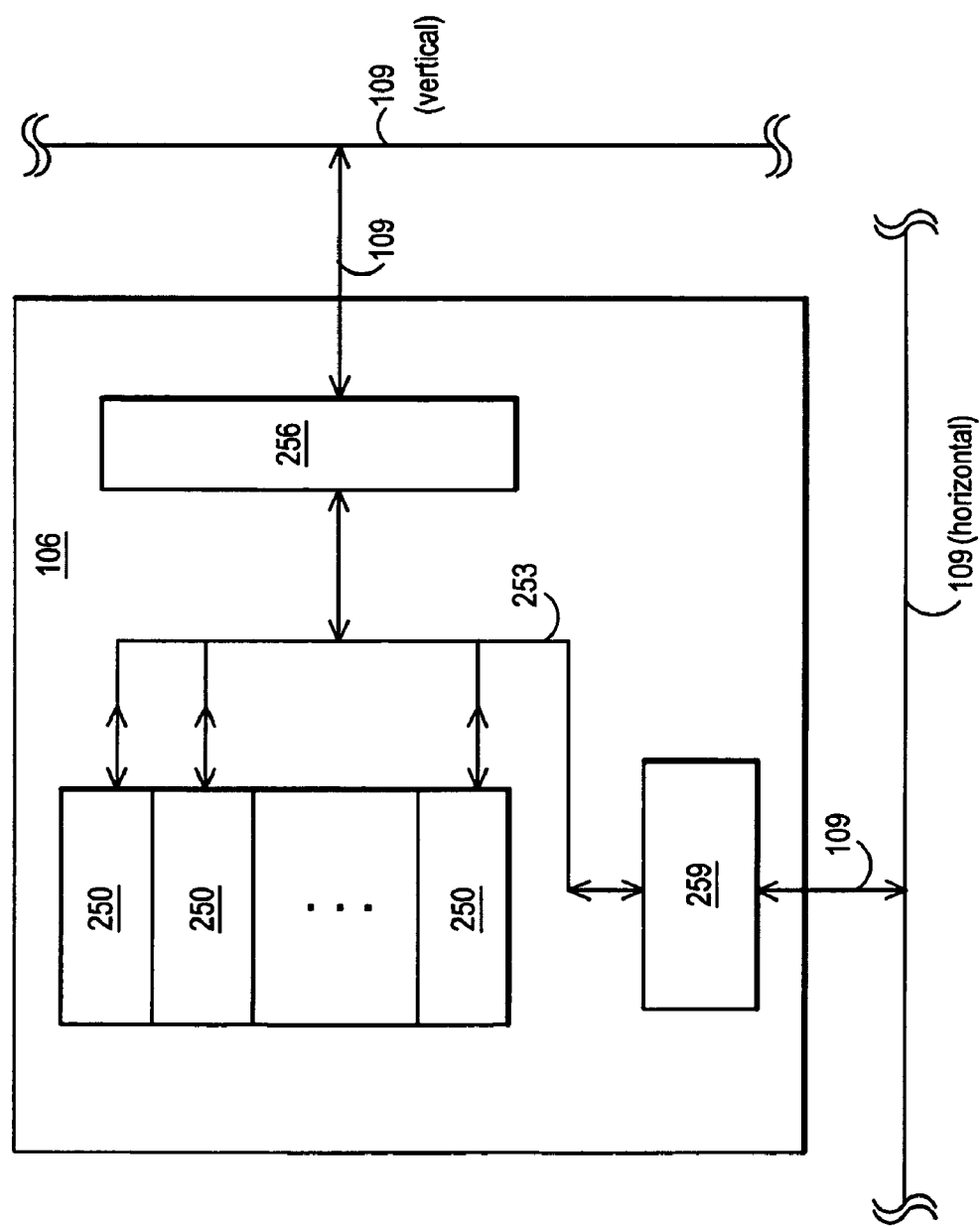
FIG. 3 depicts a block diagram of a portion of programmable logic circuitry in a PLD according to an exemplary embodiment of the invention.

FIG. 3 shows a block diagram of programmable logic 106 in a PLD according to an exemplary embodiment of the invention. Programmable logic 106 includes logic elements or programmable logic circuits 250, local interconnect 253, interface circuit 256, and interface circuit 259. Logic elements 250 provide configurable or programmable logic functions, for example, LUTs, registers, product-term logic, etc., as persons of ordinary skill in the art who have the benefit of the description of the invention understand. Local interconnect 253 provides a configurable or programmable mechanism for logic elements 250 to couple to one another or to programmable interconnect 109 (sometimes called "global interconnect"), as desired.

Interface circuit 256 and interface circuit 259 provide a configurable or programmable way for programmable logic 106 block of circuitry to couple to programmable interconnect 109 (and hence to other programmable logic 106, as FIG. 3 shows). Interface circuit 256 and interface circuit 259 may include MUXs, registers, buffers, drivers, and the like, as persons of ordinary skill in the art who have the benefit of the description of the invention understand.

In exemplary embodiments according to the invention, power consumption is reduced by providing separate power supply voltages or power supplies for regions of CRAM 133 and pass gates, and for logic and routing, and determining appropriate voltages for the power supplies. In such a configuration, one power supply is used for CRAM 133 and pass transistor gates, and another power supply is provided for drivers and programmable logic 106.

Figure 4:
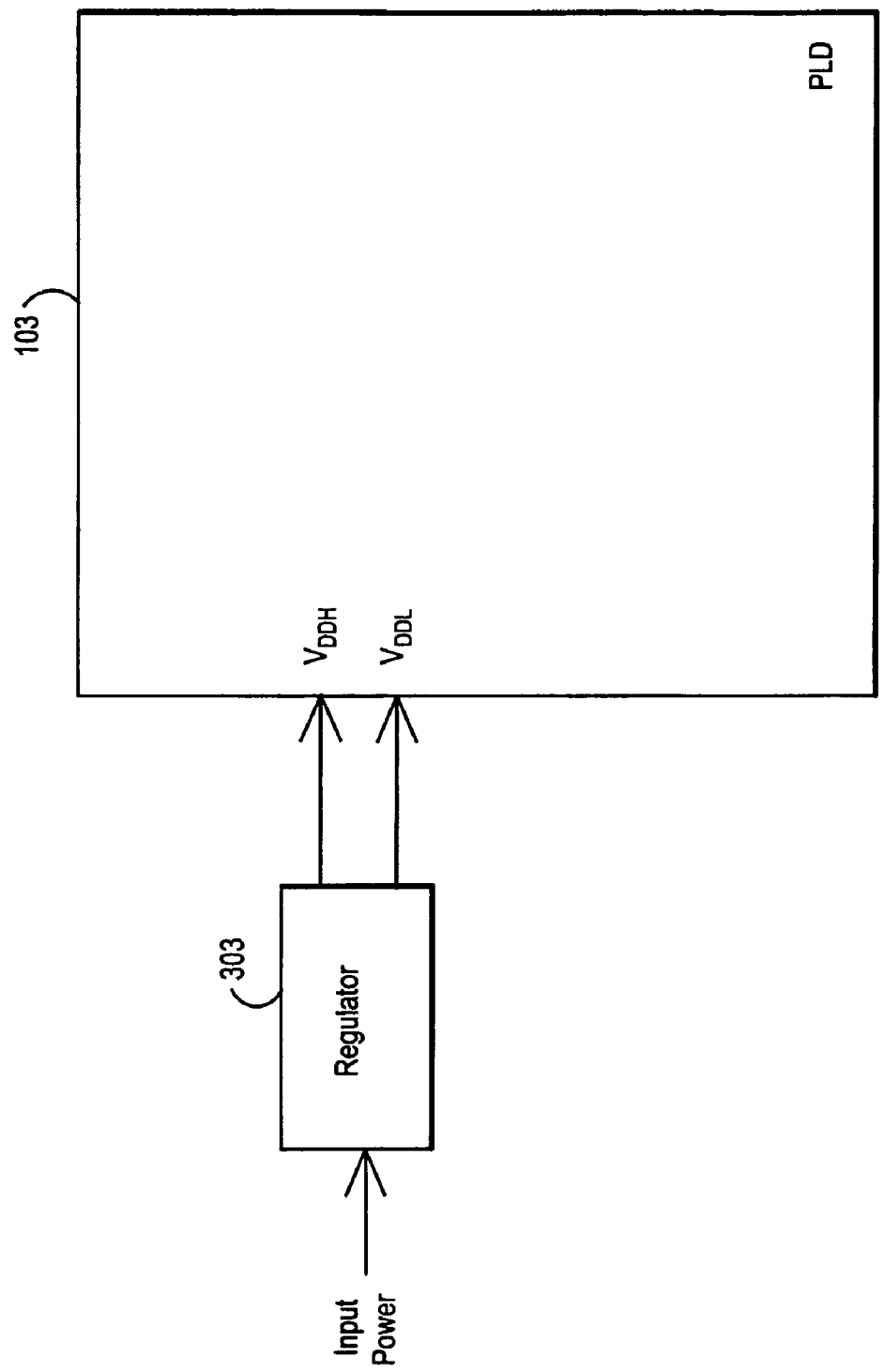
FIG. 4 shows a block diagram of a multi-supply-voltage PLD according to an exemplary embodiment of the invention.

FIG. 4 illustrates a block diagram of a multi-supply-voltage PLD according to an exemplary embodiment of the invention. PLD 103 uses two supply voltages, a lower supply voltage and a higher supply voltage, denoted as $V_{DDL}$ and $V_{DDH}$, respectively. The supply voltages are generated by power supply or regulator 303, which converts or regulates input power. One may design regulator 303 to supply $V_{DDL}$ and $V_{DDH}$, or other supply voltages in addition to those two voltages, as desired.

Other supply voltages (not shown explicitly in the figures), such as body bias voltages, Vbb_p, Vbb_nl, and Vbb_nh may also be supplied, as desired. Such voltages may be used as configurable body bias voltages, for use, for example, as described in U.S. patent application Ser. No. 10/865,402, Attorney Docket No. ALTR:026CIP, titled "Apparatus and Methods for Adjusting Performance of Integrated circuit," filed on Jun. 10, 2004. In one embodiment, a single Vbb_p may be supplied to a single N-well, and various regions on the chip may select between Vbb_nl and Vbb_nh for P-wells, depending on whether a region of the PLD is designated as low speed or high speed, respectively.

Furthermore, one may obtain at least one of the supply voltages from another source, as desired. Put another way, in such a configuration, regulator 303 supplies at least one of the supply voltages $V_{DDL}$ and $V_{DDH}$. At least one of the supply voltages ($V_{DDL}$ and $V_{DDH}$) is determined by a CAD flow (described below in detail) to meet performance requirements of a user's design when implemented using PLD 103.

Each of the supply voltages ($V_{DDL}$ and $V_{DDH}$) provides power to at least a portion of the PLD. As noted, the $V_{DDL}$ supply has a lower voltage level than does the $V_{DDH}$ supply. The lower voltage level of the $V_{DDL}$ supply reduces or (tends to reduce) power consumption within the PLD. More specifically, because power dissipation and, hence, consumption, varies as the square of the supply voltage, using a $V_{DDL}$ supply with a lower voltage level reduces (or tends to reduce) the PLD's power consumption, as compared to the case where one supply voltage, say, $V_{DDH}$, supplies power to the PLD.

Figure 5:
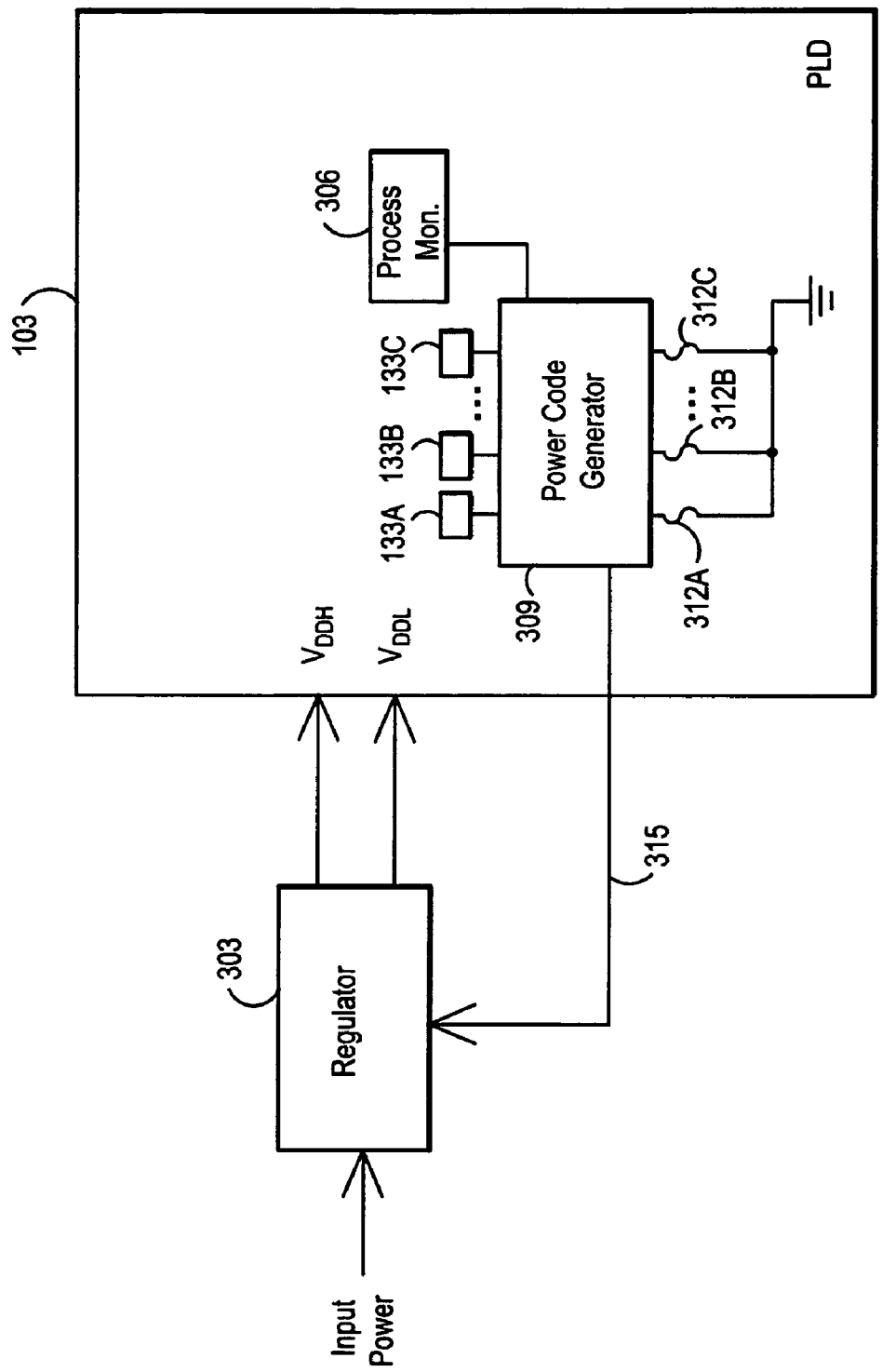
FIG. 5 illustrates a block diagram of a multi-supply-voltage PLD according to another exemplary embodiment of the invention.

FIG. 5 illustrates a block diagram of a multi-supply-voltage PLD according to another exemplary embodiment of the invention. In this arrangement, PLD 103 transmits to power regulator 303 control or information signals for the specific values desired for one or more supply voltages ($V_{DDL}$, $V_{DDH}$), as well as any body bias voltages. The determination of the particular values of the supply voltage(s) is made by circuitry within PLD 103, for example, control circuitry 136 in FIG. 1), based on information generated by a CAD flow that chooses optimized or optimal voltage values, together with other parametric information. According to factors such as the relative current demands of the various power supplies, some of the power supplies (or some of their constituent parts/components) may be regulated on-chip or off-chip, as desired.

Information to represent the supply voltage(s) is stored in CRAM cells 133A-133C. Based on information in CRAM cells 133A-133C, power code generator 309 generates one or more signals 315 and supplies the signal(s) to regulator 303. Regulator 303 generates supply voltage(s) that correspond to information it receives via signal(s) 315. In other words, signal(s) 315 act as control signal(s) for regulator 303 and determine the levels of its output voltages.

Note that, in addition to information in CRAM cells 133A-133C, power code generator 309 may use other information in order to generate control signal(s) 315. For example, power code generator 309 may use information specific to a particular die, such as process related data stored on fuse-programmed memory cells 312A-312C at wafer sort time.

Other possibilities include circuits to measure process related information and incorporate the information in control signal(s) 315. For example, if the particular die has fast transistors then it will be possible to reduce the value of the supply voltage and still meet the user's performance (e.g., speed) requirements. In general, circuitry in power code generator 309 may determine the appropriate control signal(s) 315 to send as a function of both the desired supply voltage chosen by the CAD flow for some nominal process variation, and the specific process variation information encoded on that die in fuses or other non-volatile memory, or the values determined by process monitoring circuit 306.

Persons of ordinary skill in the art who have the benefit of the description of the invention understand that one may use a variety of circuit arrangements according to the invention. For example, in one embodiment, the power regulator 303 may be included or integrated on the die of PLD 103 (or in a multi-chip module or the like) to eliminate the need for a separate regulator chip. In another embodiment, part of power regulator 303 (such as a control circuit or a switching transistor) may be on PLD 103, and another part of power regulator 303 (such as an inductor or capacitor) may be external to PLD 103, as desired. As another option, power regulator 303 may be entirely external to PLD 103, as desired.

According to the inventive concepts, at least two power supplies are provided to PLD 103. A first power supply, $V_{DDH}$, or the CRAM power supply, is distributed to parts of CRAM 133 that control pass transistors in the routing fabric of PLD 103. A second power supply, $V_{DDL}$, or the core power supply, is distributed to other logic in the core of PLD 103 (e.g., logic fabric and routing, possibly including memories and other functional blocks).

The supply voltage for CRAM 133 is no larger than the nominal maximum voltage allowable in the process, $V_{DDNOM}$, and the core supply voltage is no greater than the supply voltage for CRAM 133. $V_{DDNOM}$ may be the same as $V_{DDH}$ in the event that the CRAM power supply is not increased beyond the nominal supply voltage. In general, $V_{DDH}$ is at least as high as, or possibly higher than, $V_{DDNOM}$. Because the core power supply ($V_{DDL}$) feeds both the routing and logic fabric, the particular value of the voltage supplied to it will determine the performance of the logic and routing in PLD 103. The core power supply may be either designed to provide a particular voltage, or it may be configurable, as desired, and as described below in detail.

In one embodiment, the appropriate supply voltages are determined in advance and the power supply is designed or configured externally to PLD 103 to provide those voltages. The voltage specifications for at least one of the supplies is determined by a CAD flow that determines the supply voltage so as to meet the performance specifications of the user's circuit. The voltage specification provided by the CAD flow is used to design a power supply that provides that specific voltage for the particular PLD user's design.

In another embodiment, a configurable power supply is used. A configurable power supply receives signals (e.g., signal(s) 315) from PLD 103 indicating the specific value to be supplied for at least one of the supply voltages. PLD 103 generates voltage control information using any one or more of on-die non-volatile memory, configuration bits, and on-die parametric measurement circuits.

The on-die non-volatile memory 133A-133C may be used to store process-related information that is used to determine the specific voltage. For example, a die with fast transistors may have a code that indicates that a lower voltage may be used to achieve a specific performance level. Alternatively, or in conjunction with this scheme, on-die measurement circuits can sense performance-related parameters and use the parameters to provide voltage control information to regulator 303. For example, measurement of the saturation drain current ($I_{dsat}$) or the delay of various PLD circuit structures, such as logic or routing components, can be performed and used to adjust supply voltage(s) to meet performance specifications.

CRAM 133 may indicate that some adjustment of the voltage should be performed to meet the user's specific performance specifications. For example, a user circuit that does not need to run at the maximum speed attainable by PLD 103 may have a code that indicates that a lower supply voltage may be used. The values to store in CRAM 133A-133C are determined by a CAD flow that determines the adjustment to the voltage that can be applied to reduce power while meeting the user's circuit performance specifications.

Note that, even without considering process modifications, it may be possible to apply a slightly higher than nominal power supply voltage for the core logic to CRAM 133 because the elements of CRAM 133 do not usually switch during circuit operation. Thus, possible device performance degradation caused by a higher supply voltage may be acceptable, as long as it does not result in device failure.

For example, in a process in which a maximum supply voltage of 1.1 volts is acceptable for switching logic, it may be acceptable to apply 1.25 volts to CRAM 133 without causing failure. Although the performance of the CRAM may degrade somewhat over time, the degradation does not materially affect operation of the circuit because the switching times of CRAM 133 do not affect the operation of the circuit (after configuration is done). Furthermore, one may accommodate such degradation through circuit design techniques, as persons of ordinary skill in the art who have the benefit of the description of the invention understand.

Contemporary PLDs typically use a collection of routing MUXs controlled by CRAM elements to route signals between logic elements or blocks of programmable logic 106. Conventionally, these MUXs are composed of a set of NMOS pass transistors, which consume a lower die area than a complementary metal oxide semiconductor (CMOS) implementation. Further, some PLDs use LUTs to implement the logic blocks (e.g., programmable logic 106), which also includes one or more MUXs. Some of the logic stages of the MUXs are implemented with NMOS pass transistors.

Figure 6:
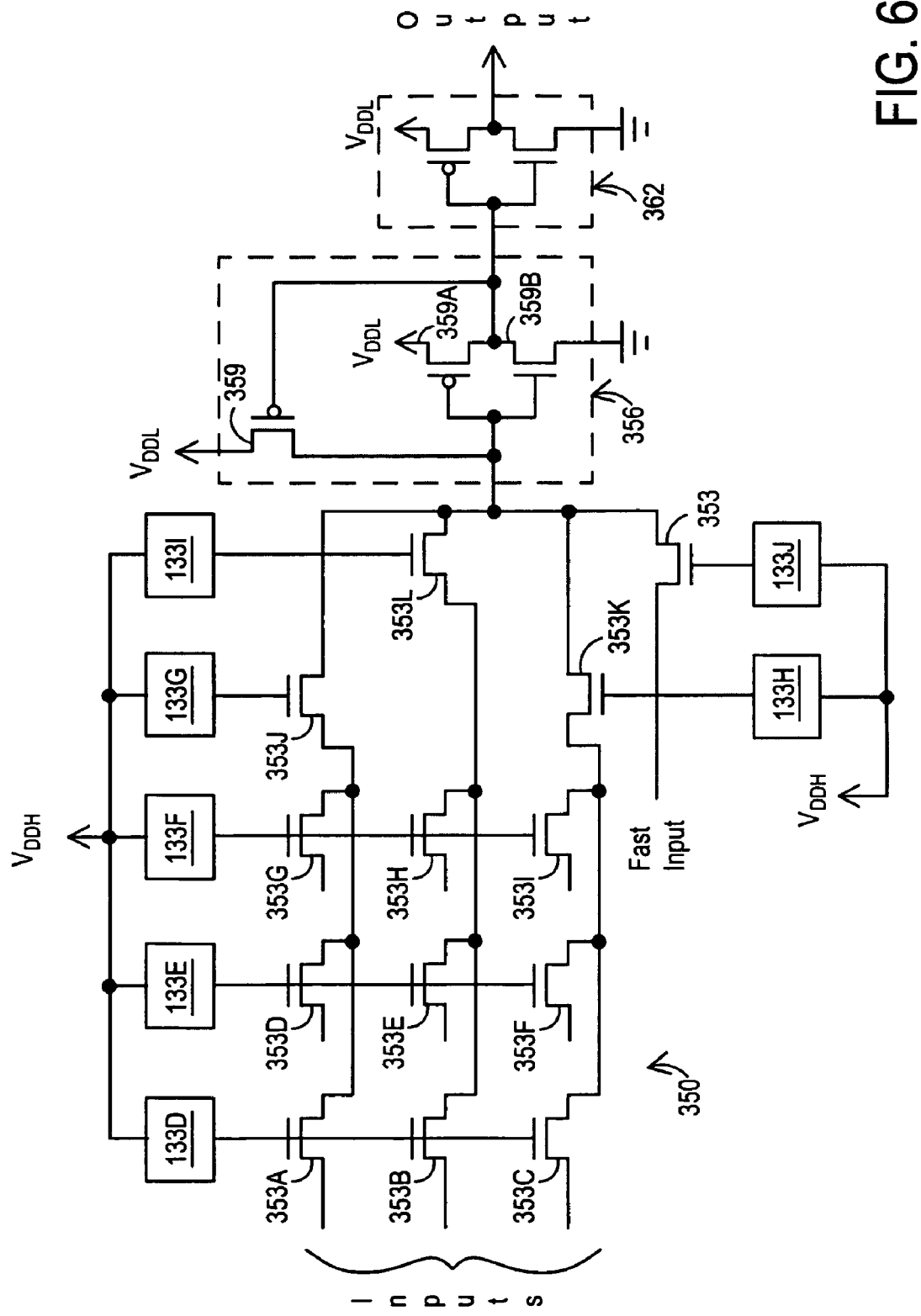
FIG. 6 depicts a circuit arrangement for a routing multiplexer and driver according to an exemplary embodiment of the invention.

FIG. 6 illustrates a circuit arrangement for a routing multiplexer and driver according to an exemplary embodiment of the invention. The circuit arrangement in FIG. 6 includes CRAM cells 133D-133J, three-input MUX 350, transistor 353 for providing a fast input, level-restored inverter (or buffer) 356, and inverter (or buffer) 362.

MUX 350 includes transistors 353A-353L, arranged in a configuration, and operate in a manner, that persons of ordinary skill in the art who have the benefit of the description of the invention understand. CRAM cells 133A-133I couple to transistors 353A-353L, respectively. The contents of CRAM cells 133A-133I determine which of transistors 353A-353L conducts and, hence, the routing functionality that MUX 350 realizes. The output of MUX 350 couples to the input of level-restored inverter 356.

As noted, the circuit arrangement includes a fast input coupled to transistor 353. CRAM cell 133J controls the operation of transistor 353. By turning on transistor 353, one may couple the fast input to the input of inverter 356 directly, thus bypassing MUX 350. By bypassing MUX 350, the fast input experiences a shorter delay path and therefore affects the output of the circuit arrangement (i.e., the output of inverter 362) faster.

The output of MUX 350 and the output of transistor 353 couple to the input of inverter 356. Because it receives its input through at least one pass transistor, level-restored inverter 356 uses regenerative feedback to provide a logic low output in response to a nominal logic high input.

Level-restored inverter 356 includes p-channel transistor 359A and n-channel transistor 359B, arranged in as a conventional inverter. In addition, level-restored inverter 356 includes p-channel transistor 359. The gate of transistor 359 couples to the output of inverter 356. The source of transistor 359 couples to $V_{DDL}$. The drain of transistor 359 drives the input of inverter 356. By coupling from the output of inverter 356 to its input, transistor 359 provides regenerative feedback and thus restores (or pulls down) the output level of inverter 356 when the output level has a nominal logic low value (i.e., it helps pull or lift the input voltage to a logic high value of approximately $V_{DDL}$). The output of level-restored inverter 356 drives the input of inverter 362. Inverter 362 has a circuit arrangement known to persons of ordinary skill in the art.

Note that the $V_{DDH}$ supply provides supply voltage to CRAM cells 133D-133J. The relatively high voltage level of $V_{DDH}$ allows a higher output voltage of pass transistors 353A-353L and 353. In level-restored inverter 356, transistor 359 may receive power from the $V_{DDL}$ or $V_{DDH}$ supplies, as desired (in the embodiment shown, transistor 359 receives power from $V_{DDL}$). Transistors 359A-359B in inverter 356 and the transistors in inverter 362 receive their power supply from the $V_{DDL}$ supply. The relatively low level of $V_{DDL}$ reduces or tends to reduce the power dissipation in the circuit.

Generally speaking, one would find operating logic fabric at the $V_{DDL}$ level desirable so as to minimize power. LUT-based logic elements, however, may contain NMOS pass transistors with gates not driven by CRAM 133 but instead by logic signals from the routing fabric. Typically the first one or two stages of the LUT use NMOS pass transistors, whereas the remainder of the LUT uses full CMOS pass gates.

In such a situation, the routing signals will swing up to $V_{DDL}$ if the final stage of routing multiplexers (e.g., the input MUXs of the logic elements) use $V_{DDL}$ as their supply voltage. To ensure that the LUT operates correctly and with reasonable speed, one aspect of the inventive concepts boosts the NMOS gate control signals to the level of the $V_{DDH}$ Supply. One may do so by using level converters that boost or restore the $V_{DDL}$ level to the $V_{DDH}$ level. One may supply the CRAM cells that provide the data inputs to the LUT from either the $V_{DDL}$ or $V_{DDH}$ supply, as desired.

Figure 7:
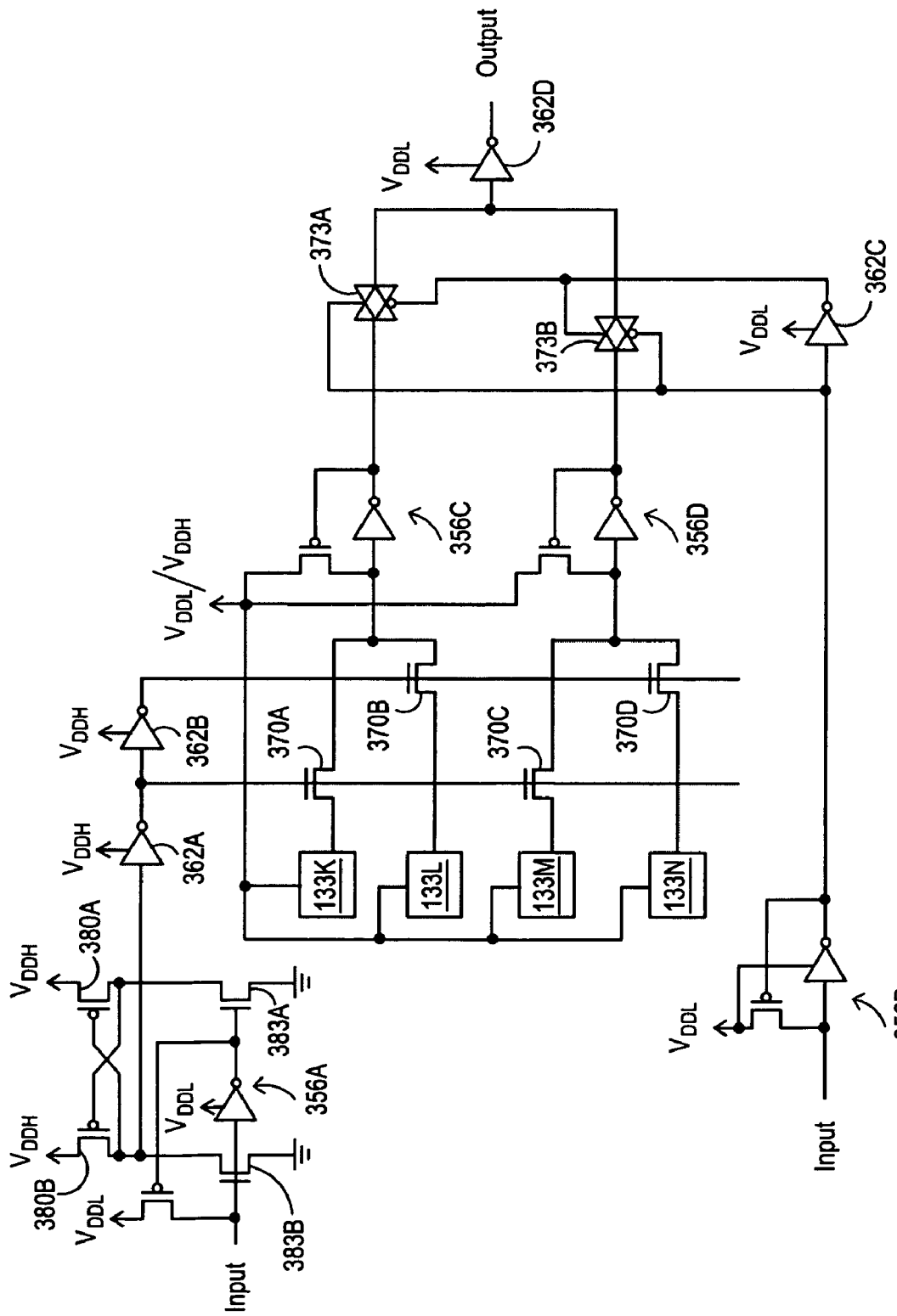
FIGS. 7-10 show circuit arrangements according to exemplary embodiments of the invention that use multiple supply voltages applied to LUT circuitry within a PLD.

FIG. 7 shows a circuit arrangement according to an exemplary embodiment of the invention that uses multiple supply voltages to supply power to LUT circuitry within a PLD. Note that, although FIG. 7 shows a two-input LUT, one may apply the inventive concepts to LUTs with other numbers of inputs, as desired, by making modifications to the circuit arrangement in FIG. 7. Those modifications fall within the level of skill of persons of ordinary skill in the art who have the benefit of the description of the invention.

In the circuit arrangement of FIG. 7, the first stage of the LUT uses NMOS pass transistors 370A-370D, which are driven to $V_{DDH}$. More specifically, the circuit arrangement includes a level converter to restore the signal levels. The level converter includes level-restored inverter 356A, supplied from $V_{DDL}$, pull-down NMOS transistors 383A and 383B, and cross-coupled pull-up PMOS transistors 380A and 380B. In this arrangement, because some switching transistors are supplied by $V_{DDH}$, the voltage must not exceed the maximum value that can be tolerated by the transistors without unacceptable performance degradation over the lifetime of the device.

Level-restored inverter 356A drives transistors 383A and 383B with complementary signals derived from an input signal applied to the input of level-restored inverter 356A. The cross-coupled transistors 380A and 380B provide a $V_{DDH}$-referenced output signal to a pair of $V_{DDH}$-referenced cascaded inverters 362A-362B.

The cross-coupled gates of transistors 380A-380B cause positive feedback that in turn causes the output signal of the level converter to rise to $V_{DDH}$. Note that, generally, any stages using $V_{DDH}$ should use PMOS pull-up transistors coupled to $V_{DDH}$, and buffers following that stage should also be powered by $V_{DDH}$ to enable them to fully shut off the PMOS pull-up transistors. Furthermore, any PMOS pass gates in the following stages should have their body coupled to $V_{DDH}$ in order to prevent forward biasing the source junctions. Independent of the foregoing, however, it may be desirable to couple all body terminals of PMOS devices to a single $V_{DDH}$ in order to avoid increasing device area due to N-well spacing.

Cascaded inverters 362A-362B provide the gate signals for NMOS pass transistors 370A-370D. Depending on the gate signal levels, transistors 370A-370D selectively pass signals from CRAM cells 133K-133N, respectively, to a pair of level-restored inverters 356C-356D. The outputs of inverters 356C-356D drive the respective inputs of CMOS transmission gates 373A-373B. The outputs of transmission gates 373A-373B drive inverter 362D (optional), which ultimately drives the output of the circuit.

Another input of the LUT feeds level-restored inverter 356B. The output of inverter 356B, together with inverter 362C, drive the inputs of transmission gates 373A and 373B, respectively.

Note that inverters 356A and 356B are supplied by (referenced to) the $V_{DDL}$ supply, as are inverters 362C and 362D. Inverters 362A-362B are $V_{DDH}$-referenced because the output of the level converter is also $V_{DDH}$-referenced. Note that CRAM cells 133K-133N and inverters 356C-356D are supplied from the same supply, i.e., either $V_{DDL}$ or $V_{DDH}$, as desired. Note further that, if inverters 356C-356D use the $V_{DDH}$ supply, then transmission gates 373A-373B should also use $V_{DDH}$ as their body supply voltage ($V_{BB}$) in order to prevent the source junctions from becoming forward-biased.

In an alternative embodiment, one may provide buffers to buffer the output signals of CRAM cells 133K-133N. The buffers may help to avoid noise coupling back into the CRAM cells. In such an arrangement, it may be desirable to operate the CRAM cells from $V_{DDH}$ to enable all CRAM cells to share a single supply, thus simplifying the power network. One may also operate the buffers at the outputs of the CRAM cells from the $V_{DDL}$ supply in order to reduce power consumption. The buffers may have the bodies of the PMOS transistors coupled to $V_{DDL}$ (because the insulated gate terminal of the associated transistor is driven to $V_{DDH}$ and the rest of the transistor may be $V_{DDL}$-referenced). Alternatively, the bodies may be coupled to $V_{DDH}$ in order to avoid the need for extra N-well spacing.

Figure 8:
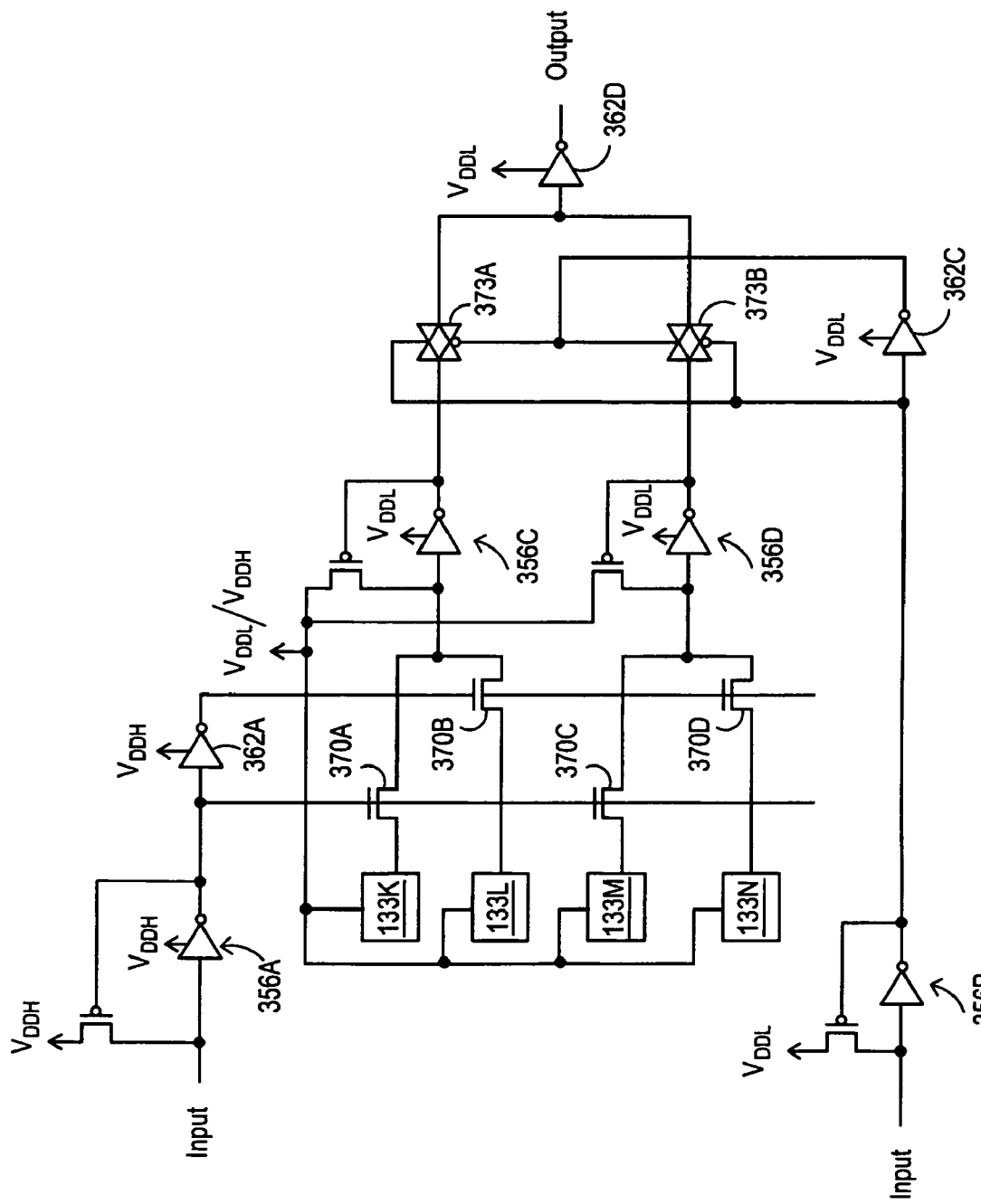
Figure 9:
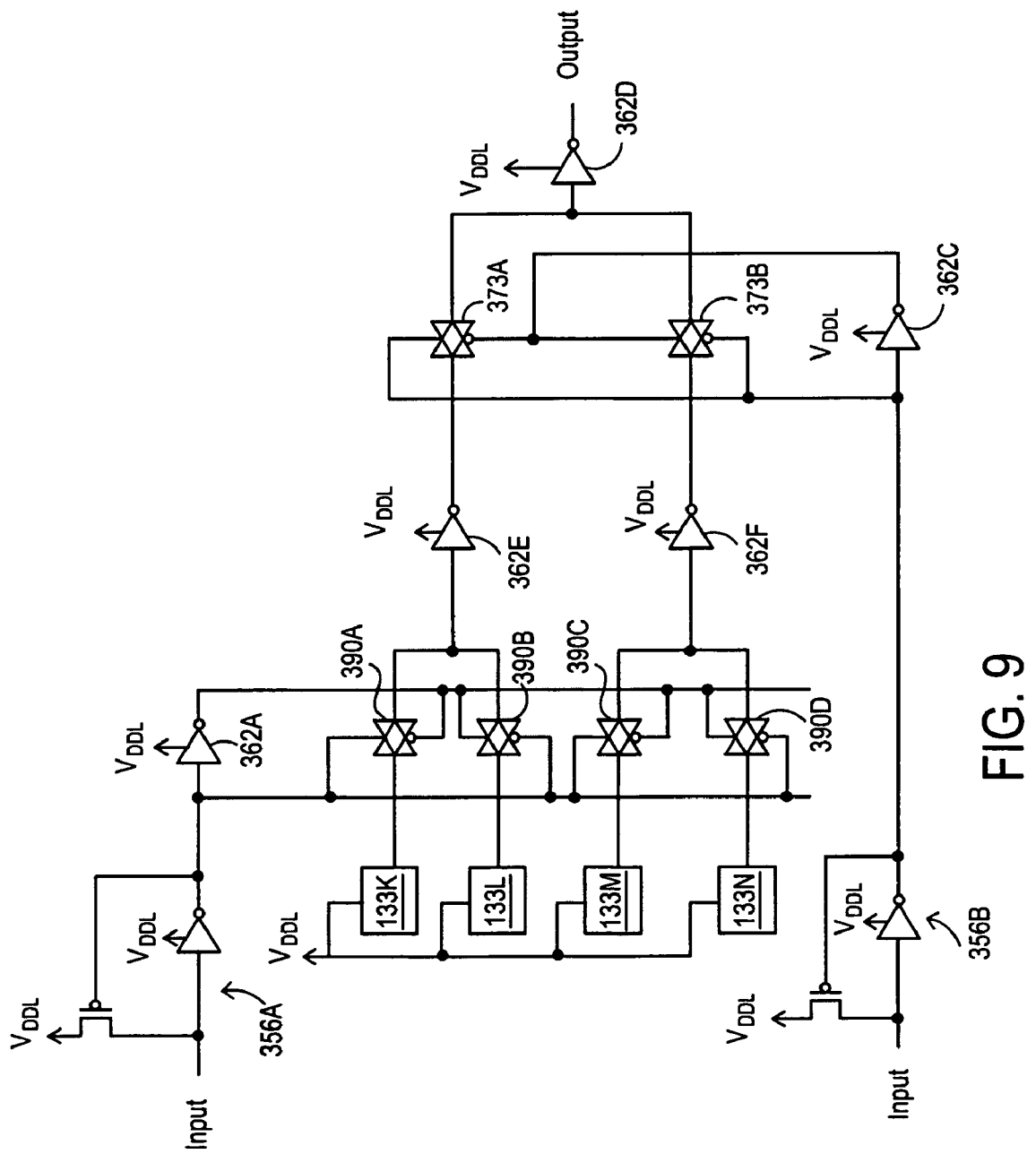
Figure 10:
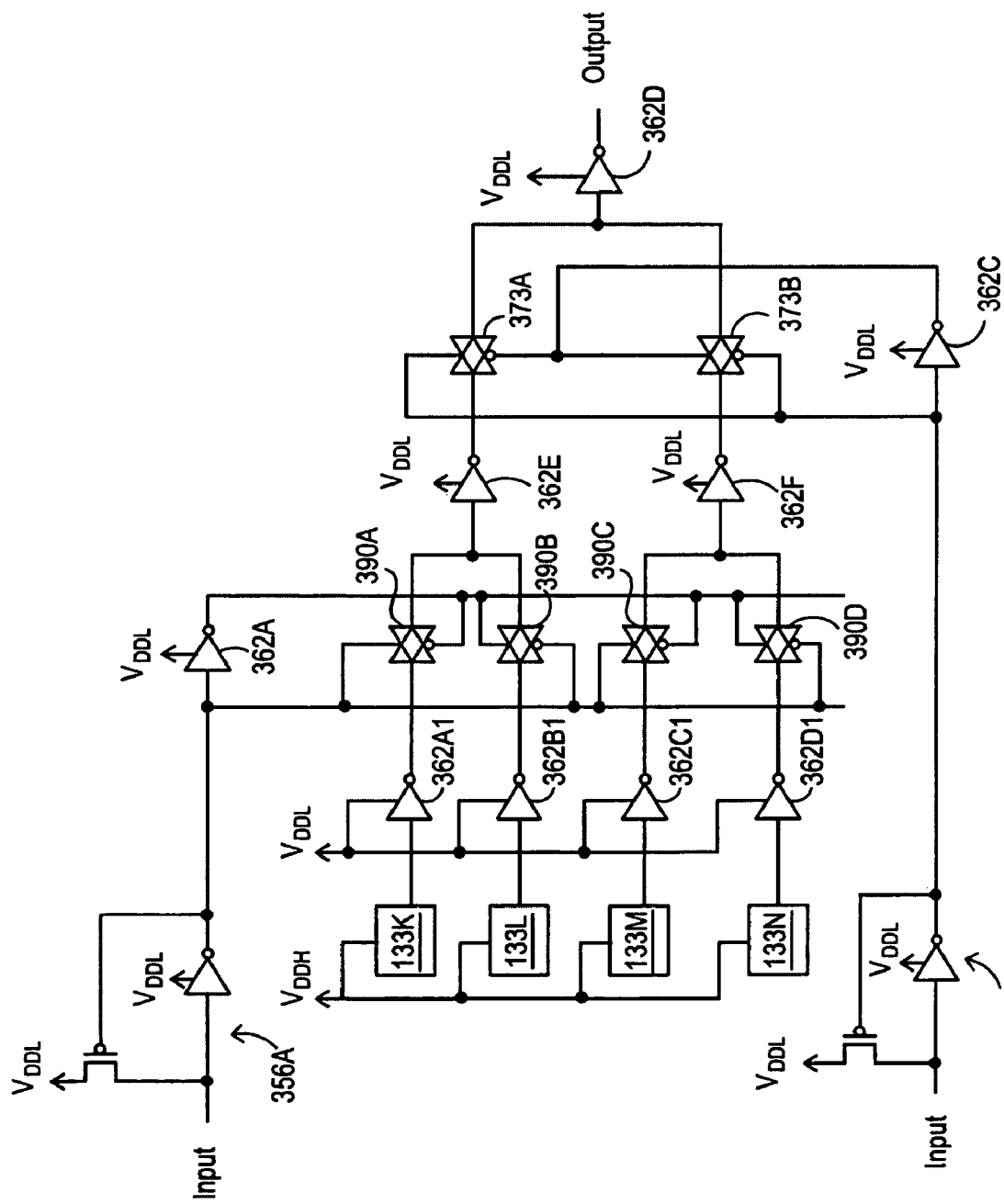

One may make a wide variety of modifications to the circuit arrangement in FIG. 7 so as to suit a particular application or implementation. FIGS. 8-10 show several examples.

FIG. 8 illustrates a circuit arrangement derived from the circuit arrangement of FIG. 7, which uses a simplified level converter. More specifically, the circuit arrangement in FIG. 8 uses a level-restored inverter 356A, powered by the $V_{DDH}$ Supply. This circuit arrangement saves some components compared to the arrangement in FIG. 7. In the arrangement in FIG. 8, however, $V_{DDL}$ should not be less than ($V_{DDH}-V_{TN}$), where $V_{TN}$ denotes the NMOS transistor's threshold voltage, in order to prevent current from flowing from the $V_{DDH}$ supply to the $V_{DDL}$ supply, which would potentially cause increased leakage in inverter 356A.

FIG. 9 depicts a circuit arrangement derived from the circuit arrangement of FIG. 8, which uses a CMOS LUT stages. More specifically, the outputs of CRAM cells 133K-133N drive CMOS transmission gates 390A-390D, which in turn drive the following stages described above. The circuit arrangement in FIG. 9 provides the advantage of being able to operate from (or tolerate) the $V_{DDL}$ levels in the LUT, and it also reduces power consumption. Note that one may use the level converter of FIG. 7 or FIG. 8, as desired.

FIG. 10 shows a circuit arrangement derived from the circuit arrangement of FIG. 9, which buffers the outputs of the CRAM cells. More specifically, the circuit arrangement in FIG. 10 includes inverters 362A1-362D1, the respective inputs of which couple to the respective outputs of CRAM cells 133K-133N. In this arrangement, CRAM cells 133K-133N are powered by $V_{DDH}$, and the following buffers are powered by $V_{DDL}$, thus reducing power consumption. Note that one may use the level converter of FIG. 7 or FIG. 8 or 9, as desired.

Another aspect of the invention relates to using multiple power supplies to reduce power consumption in memory circuitry in PLDs. Typically, memory designs exhibit some sensitivity to the supply voltage level. In other words, a memory may not operate with acceptable margins across a wide range of supply voltages. Consequently, one may supply power to the memory circuits on the PLD at the $V_{DDNOM}$ level. It may be advantageous, however, to operate from other supply voltages (e.g., $V_{DDL}$) other circuitry on the PLD that interfaces with, or couples to, the memory circuitry. One may use the techniques described above to convert between the supply voltages at the appropriate interface. As a result, one can ensure proper operation of the memory circuitry and also reduce overall power consumption in the PLD.

Figure 11:
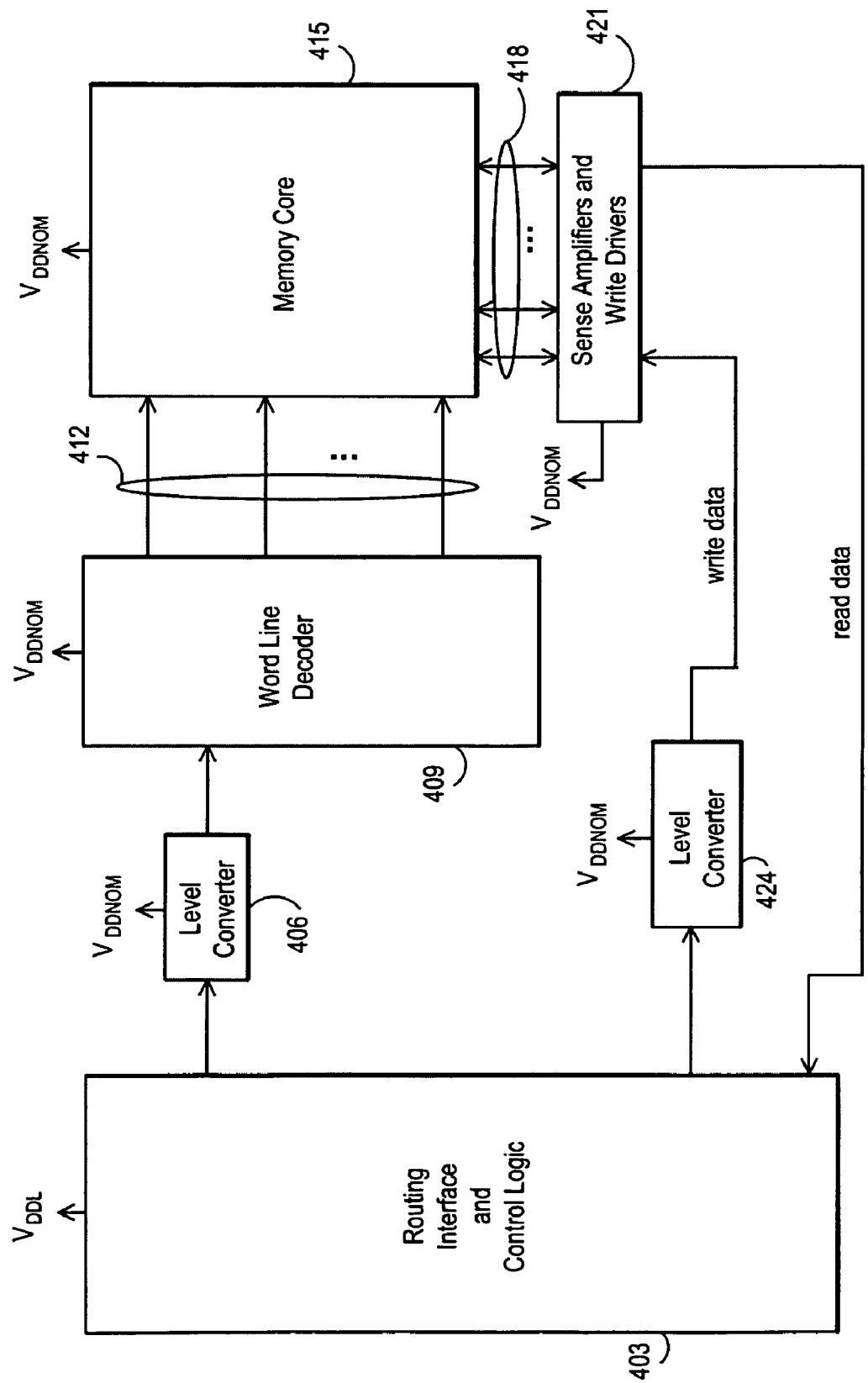
FIG. 11 illustrates a circuit arrangement, supplied by multiple supply voltages, of a portion of a PLD according to an illustrative embodiment of the invention that includes memory circuitry.

FIG. 11 shows a circuit arrangement, supplied by multiple supply voltages, of a portion of a PLD according to an illustrative embodiment of the invention that includes memory circuitry. More specifically, the circuit arrangement includes routing interface and control logic 403, level converter 406, word line decoder 409, memory core 415, sense amplifiers and write drivers 421, and level converter 424.

Routing interface and control logic 403 allows interfacing the memory circuitry to the rest of the PLD. Routing interface and control logic 403, together with level converter 406 and word line driver 409 facilitates addressing a row in memory core 415. Word line driver 409 generates a plurality of word lines 412 that it provides to memory core 415.

That circuit construct, together with routing interface and control logic 403, level converter 406 and sense amplifiers/write drivers 421, allows other PLD circuitry (not shown) to write information to memory core 415 and to retrieve information from memory core 415. Sense amplifiers/write drivers 421 communicate with, and exchange information with, memory core 415 via a plurality of signal lines 418. Note that memory core 415 may constitute a memory block, such as an array of contiguous memory cells, or other suitable memory structure, as desired.

Generally speaking, reducing or minimizing the amount of circuitry in the memory that operates from $V_{DDNOM}$ tends to increase or maximize power savings. In the embodiment shown, memory core 415, word line decoder 409, and sense amplifiers/write drivers 421 operate from $V_{DDNOM}$.

Routing interface and control logic 403, however, operates from $V_{DDL}$ in order to reduce power consumption. Level converter 406, supplied by $V_{DDNOM}$, converts the $V_{DDL}$-referenced signals from routing interface and control logic 403 to $V_{DDNOM}$-level signals and provides those signals to word line decoder 409. Similarly, level converter 424 converts $V_{DDL}$-referenced write information from routing interface and control logic 403 to $V_{DDNOM}$-level write data that it supplies to sense amplifiers/write drivers 421. Note that the outputs of the sense amplifiers (i.e., the read data) may drive routing interface and control logic 403 directly.

Figure 12:
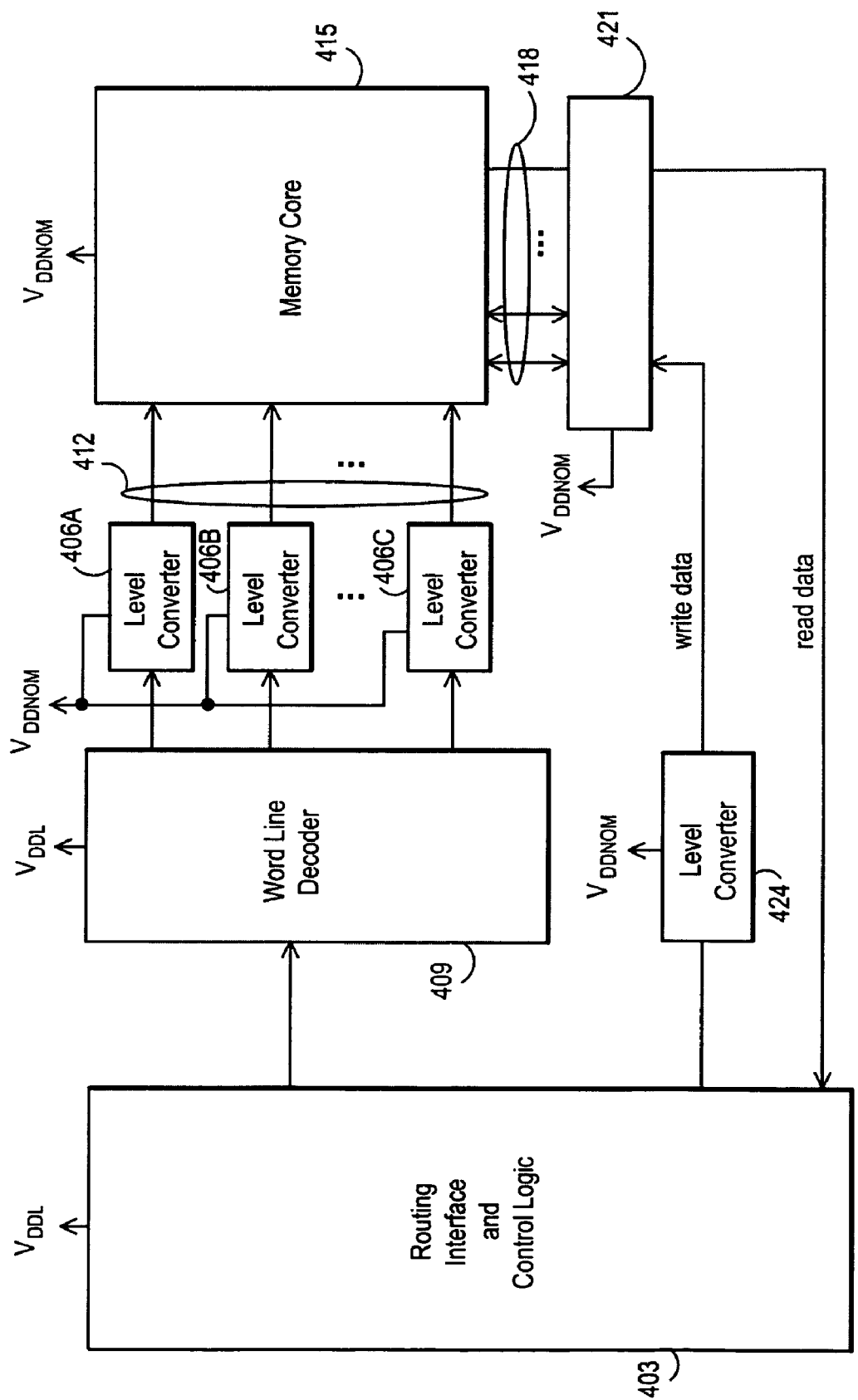
FIG. 12 depicts a circuit arrangement, supplied by multiple supply voltages, of a portion of a PLD according to another illustrative embodiment of the invention that includes memory circuitry.

In the embodiment shown in FIG. 11, level conversion is performed at the input of word line decoder 409. This arrangement increases static power consumption somewhat, but has a relatively small effect on dynamic power consumption. In an alternative embodiment, one may perform the level conversion at the output of word line decoder 409. FIG. 12 shows a circuit arrangement that uses such a level conversion scheme.

In the circuit arrangement in FIG. 12, word line decoder 409 is supplied from $V_{DDL}$, thus lowering its power consumption (for that reason, level converter 406 at the input of word line decoder is not used). Each output of word line decoder 409, referenced to $V_{DDL}$, drives a corresponding one of a plurality of level converters 406A-406C. Level converters 406A-406C converts the $V_{DDL}$-referenced input signals to $V_{DDNOM}$-referenced output signals that they supply to memory core 415.

Where a clocked memory core 415 is used, one may use word line decoder 409 as a pre-decoder. More specifically, a dynamic circuit that relies on the clocked nature of memory core 415 may be used to perform conversion. In such a circuit, a dynamic logic circuit, such as a domino logic gate known to persons of ordinary skill in the art who have the benefit of the description of the invention, has inputs driven by $V_{DDL}$ logic (e.g., routing interface and control logic 403) and uses clocked word line drivers (level converters 406A-406C) powered by $V_{DDNOM}$ to drive the word lines. Because dynamic logic can operate with inputs that are raised to a voltage reasonably close to the full supply or logic high voltage, the dynamic logic can perform level conversion without any additional transistors.

Figure 13:
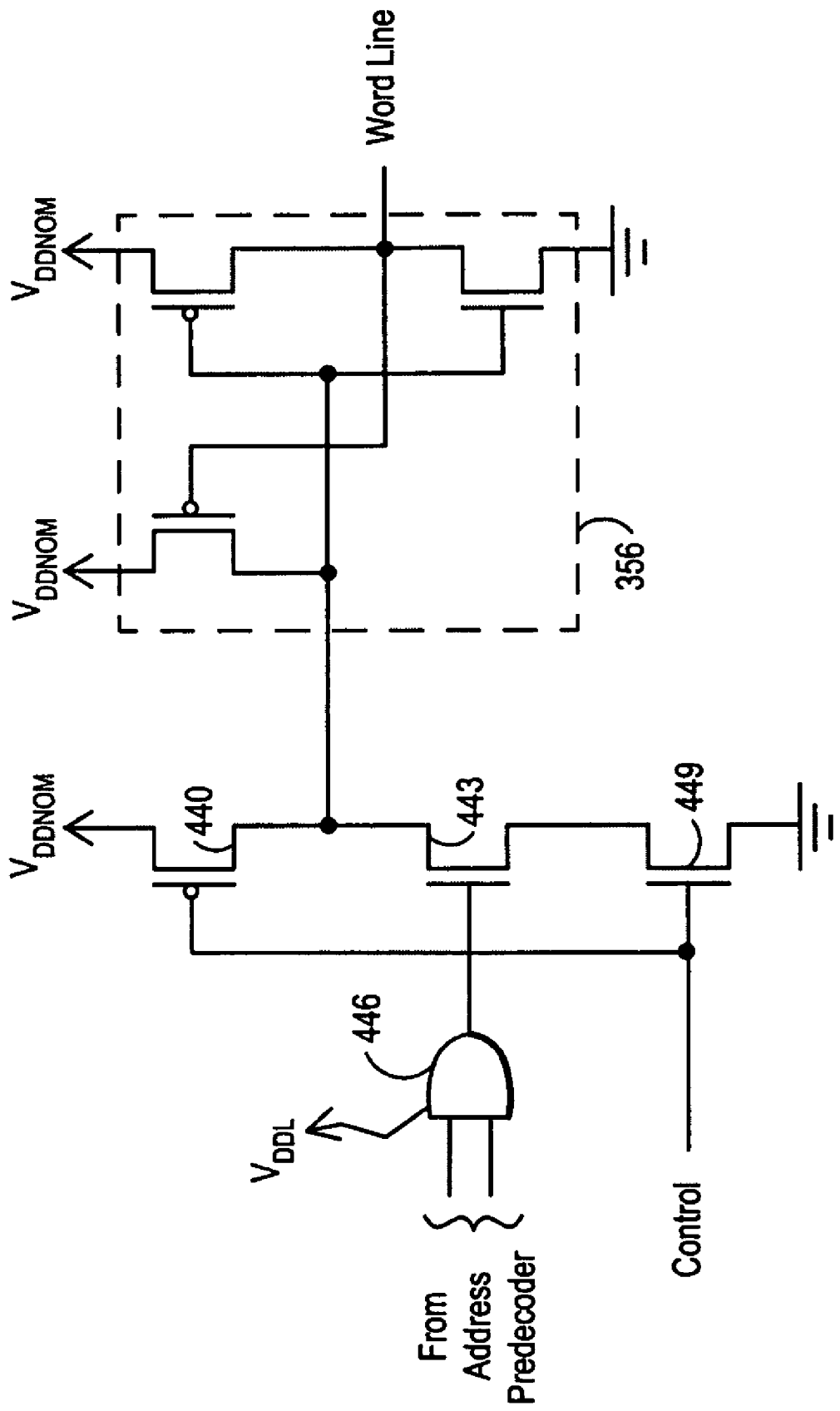
FIG. 13 shows a circuit arrangement according to an exemplary embodiment of the invention that uses dynamic logic for reducing power consumption in PLDs.

FIG. 13 shows a circuit arrangement according to an exemplary embodiment of the invention that uses dynamic logic for reducing power consumption in PLDs. More specifically, the circuit in FIG. 13 includes AND gate 446, stacked NMOS transistors 443 and 449, pull-up PMOS transistor 440, and level-restored inverter 356.

AND gate 446 essentially performs an address decoding function. As persons of ordinary skill in the art who have the benefit of the description of the invention understand, one may use other circuitry, as desired, depending on factors such as the rest of the circuitry used, the performance and design specification and methodology, etc. AND gate 446 is supplied by $V_{DDL}$. Note that, rather than two inputs, AND gate 446 may have other numbers of inputs, as desired, depending on factors such as the address decoding scheme used, as persons of ordinary skill in the art who have the benefit of the description of the invention understand.

NMOS transistors 443 and 449 and PMOS transistor 440 couple together to provide a dynamic MOS circuit. A control signal drives the gates of transistors 440 and 449. The output of AND gate 446 (or other appropriate circuit) drives the gate of transistor 443. When the control signal has a logic low state, transistor 440 is ON, transistor 449 is OFF, and the circuit pre-charges.

When the control signal has a logic high state, transistor 449 turns ON. Depending on whether transistor 443 is ON or OFF, the input of inverter 356 is either pulled to ground or is near $V_{DDNOM}$, the supply voltage to the dynamic circuit. The output of inverter 356, referenced to $V_{DDNOM}$, reflects the state of its input, i.e., the output of the dynamic circuit.

Because of the dynamic nature of the circuit, the input to the gate of transistor 443 need not swing all the way up to $V_{DDNOM}$. Given that AND gate 446 is supplied by $V_{DDL}$, the output of AND gate 446 is referenced to $V_{DDL}$. The $V_{DDL}$ level at the gate of transistor 443, however, is sufficient to turn it ON (when the inputs to AND gate 446 are both logic high) and allow the dynamic circuit to discharge and pull low the input of inverter 356.

Thus, the circuit arrangement in FIG. 13 allows using $V_{DDL}$ as the supply voltage of the address pre-decoder circuitry (not shown explicitly) and the interface circuitry (e.g., AND gate 446) to the dynamic circuitry that performs the rest of the address decode function. Note that, because it coupled to the memory core, inverter 356 provides an output voltage referenced to $V_{DDNOM}$, thus ensuring reliable operation of the memory core and the memory circuitry overall. By using $V_{DDL}$ as the supply voltage for part of the circuit, however, the circuit arrangement shown allows reduction of the overall power consumption of the PLD.

Figure 14:
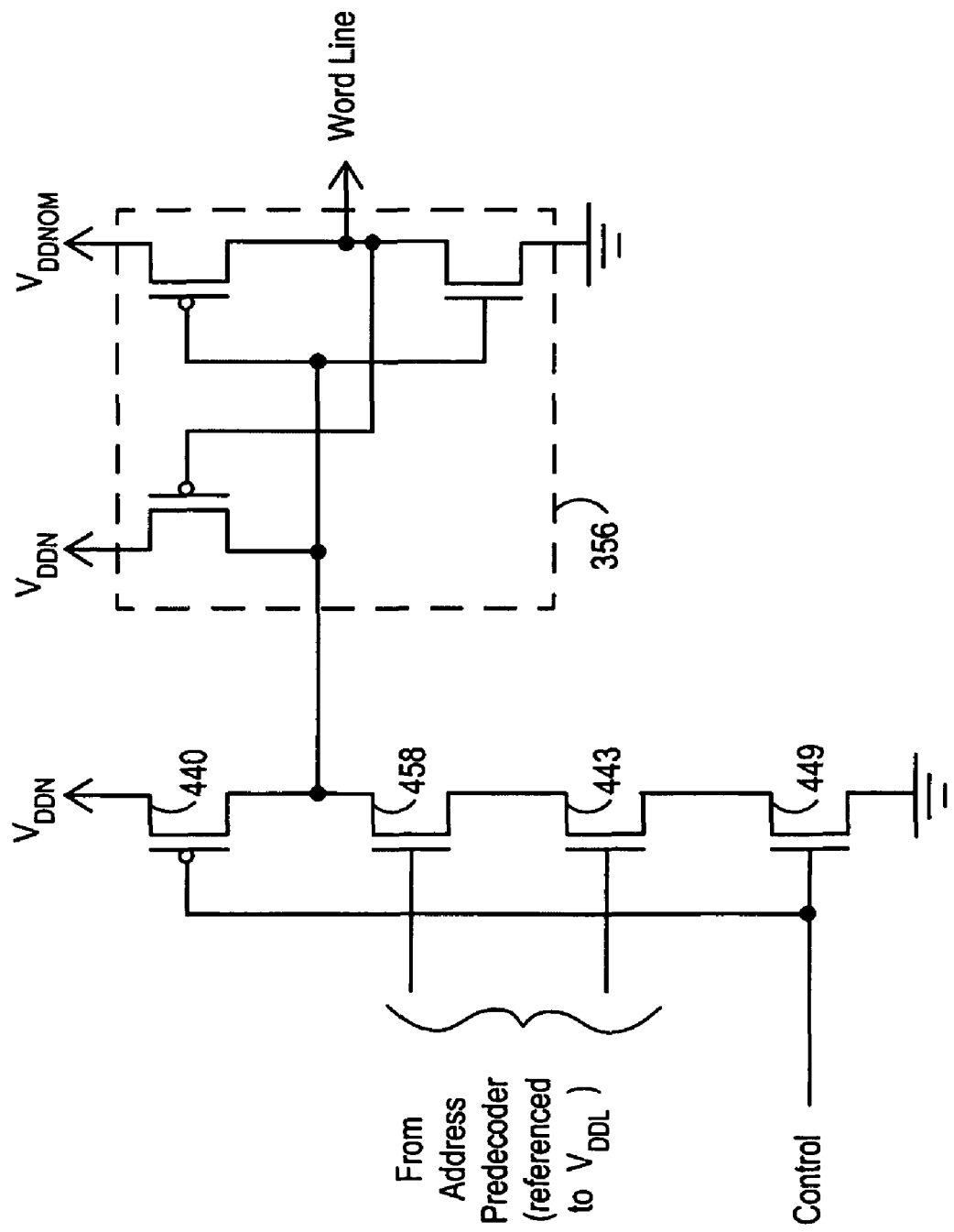
FIG. 14 illustrates a variation of the circuit arrangement of FIG. 13, according to an illustrative embodiment of the invention.

As noted above, the circuit arrangement of FIG. 13 may take a variety of forms, and the particular arrangement shown in illustrative. For example, one may subsume the functionality of the functionality of AND gate 446 within the dynamic circuit, as desired. FIG. 14 shows such a variation of the circuit arrangement of FIG. 13.

More specifically, in FIG. 14, the AND gate of FIG. 13 is omitted, and an additional NMOS transistor 458 is coupled in series with transistor 443. The input signals, provided by the address pre-decoder and referenced to $V_{DDL}$, feed the gates of transistors 443 and 458. The combination of transistors 443 and 458 provides the equivalent functionality of AND gate 446.

Similar to the signals driving AND gate 446, the signals driving the gates of transistors 443 and 458 are provided from a pre-decode circuit supplied by $V_{DDL}$. Thus, similar to the circuit in FIG. 13, the circuit arrangement in FIG. 14 provides the benefit of reducing the overall power consumption of the PLD.

Figure 15:
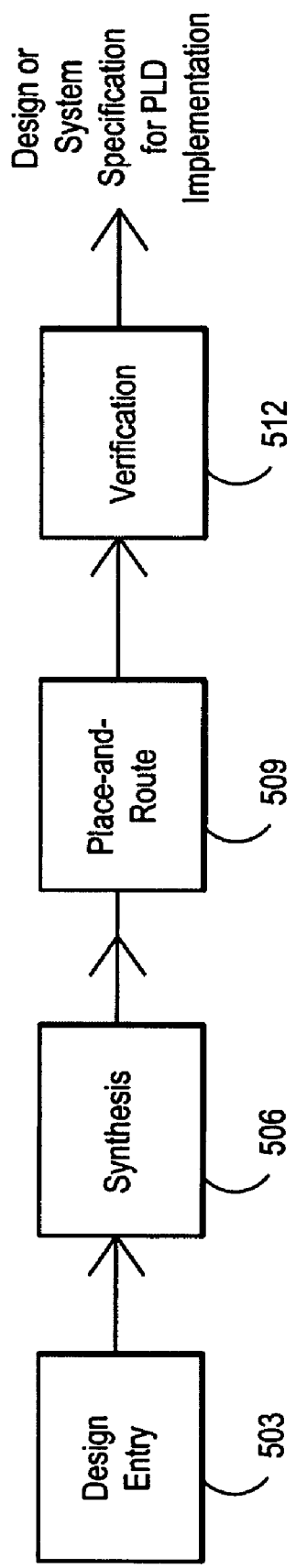
FIG. 15 depicts various software modules that PLD CAD software according to illustrative embodiments of the invention uses.

One may use PLD design software in conjunction with the techniques described here to optimize power consumption and performance in PLDs. FIG. 15 depicts various software modules that PLD computer-aided design (CAD) software according to illustrative embodiments of the invention uses. The modules include design-entry module 503, synthesis module 506, place-and-route module 509, and verification module 512. The following description provides a simplified explanation of the operation of each module, followed by a description of CAD techniques to reduce or minimize power consumption in PLDs.

Design-entry module 503 allows the editing of various design description files using graphical or textual descriptions of a circuit or its behavior, such as schematics, hardware description languages (HDL), or waveforms, as desired. The user may generate the design files by using design-entry module 503 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 506 accepts the output of design-entry module 503. Based on the user-provided design, synthesis module 506 generates appropriate logic circuitry that realizes the user-provided design. One or more PLDs (not shown explicitly) implement the synthesized overall design or system. Synthesis module 506 may also generate any glue logic that allows integration and proper operation and interfacing of various modules in the user's designs. For example, synthesis module 506 provides appropriate hardware so that an output of one block properly interfaces with an input of another block. Synthesis module 506 may provide appropriate hardware so as to meet the specifications of each of the modules in the overall design or system.

Furthermore, synthesis module 506 may include algorithms and routines for optimizing the synthesized design. Through optimization, synthesis module 506 seeks to more efficiently use the resources of the one or more PLDs that implement the overall design or system. Synthesis module 506 provides its output to place-and-route module 509.

Place-and-route module 509 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 509 helps optimize the performance of the overall design or system. By proper use of PLD routing resources, place-and-route module 509 helps to meet the critical timing paths of the overall design or system. Place-and-route module 509 optimizes the critical timing paths to help provide timing closure faster in a manner known to persons of ordinary skill in the art with the benefit of the description of the invention. As a result, the overall design or system can achieve faster performance (i.e., operate at a higher clock rate or have higher throughput). Place-and-route module 509 may use information about critical paths within the design or system to adjust power consumption of parts or all of the design or system, as desired.

Verification module 512 performs simulation and verification of the design. The simulation and verification seek in part to verify that the design complies with the user's prescribed specifications. The simulation and verification also aim at detecting and correcting any design problems before prototyping the design. Thus, verification module 512 helps the user to reduce the overall cost and time-to-market of the overall design or system.

Verification module 512 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and power-consumption estimation, as desired. Note that one may perform other or additional verification techniques as desired and as persons of ordinary skill in the art who have the benefit of the description of the invention understand. Verification of the design may also be performed at other phases in the flow, as appropriate, and as desired.

The following description provides details of several CAD methods for PLDs that use multiple supply voltages. The CAD flows or methods determine the optimal voltage to minimize power, while meeting the user's speed specifications. The optimal voltage value of $V_{DDL}$ is the lowest value that provides for correct operation of the circuit according to the user's speed/timing specifications.

Note that, as one of their constituent parts, the CAD flows use timing analysis of the user's design that the user wishes to implement using a PLD. One aspect of the invention provides several methods for the timing analysis.

Generally speaking, timing models trade off accuracy for compute-resources (e.g., time, processing power and resources, memory, computational complexity, etc.). In order to optimize the value of $V_{DDL}$, the timing models should ensure that the circuit will operate at the chosen value of $V_{DDL}$. A timing model of sufficient accuracy to ensure performance at some specific value of $V_{DDL}$ may be considered as a final timing model. A final timing model is typically made as accurate as possible, given that any inaccuracies are compensated for by providing margin in the timing of the design. Note that a final timing model may include more than one delay value for each type of resource (such as a minimum as well as a maximum delay, or the delay at various process, voltage, or temperature corners).

In order to use a specific value of $V_{DDL}$, the final timing model should have some dependence on the value of $V_{DDL}$. One goal of the timing analysis is that the delays of the actual circuit implemented in the PLD not exceed the bound on delay predicted by the final timing model. Because the absolute performance of the device is limited by the final timing model at the highest value of $V_{DDL}$ ($V_{DDL}=V_{DDNOM}$), the final timing model should be as accurate as possible at this voltage value.

Reduced accuracy may be acceptable at lower voltages, as long as the timing model is conservative (i.e., circuit delay is guaranteed to be smaller than the delay predicted by the model at any voltage). This reduced accuracy can be tolerated because the ultimate effect will be to over-predict the value of $V_{DDL}$ selected for operation, which may cause some excess power dissipation compared to a more accurate model, but yet not cause a functional failure or malfunction. As persons of ordinary skill in the art who have the benefit of the description of the invention understand, the more accurate the final timing model is across the range of supply voltage values, the closer the CAD system will be able to predict the lowest value of $V_{DDL}$ that provides circuit functionality (e.g., meeting the user's timing specifications).

In one embodiment for timing analysis, the timing properties of each type of resource (e.g., programmable logic circuit, programmable routing, etc.) are modeled as a function of $V_{DDL}$. As the value of $V_{DDL}$ is varied, the model allows performing timing analysis of the various resources.

In another embodiment, the timing of each type of resource is modeled at $V_{DDL}=V_{DDNOM}$, and one or more scaling factors are applied to various classes of resource types as a function of voltage. For example, resources might be classified as logic or routing resources, and a delay scaling function for each class may be provided as a function of supply voltage. In one exemplary embodiment, one may apply a single scaling function to all resource types. Each scaling function provides an appropriate worst case bound for the resources in that class (i.e., minimum of all for a minimum timing model, maximum of all for a maximum timing model).

One may use a variety of algorithms that use the timing analysis described above to select the supply voltage(s) of the PLD. In one embodiment the CAD flow operates by assuming that the maximum nominal supply voltage is supplied as the $V_{DDL}$ supply. The CAD flow performs clustering, placement, and routing of the user's design in the programmable logic and routing fabric, while attempting to meet the user's timing specifications with as much margin as possible. This margin will allow the value of $V_{DDL}$ to be reduced and still meet the user's timing specifications. After performing clustering, placement, and routing, a first timing analysis is performed to determine the actual amount of timing margin available to the circuit.

One may use the final timing model to determine the lowest value of $V_{DDL}$ at which the circuit can operate. This method uses one or more timing analyses using the final timing model to determine the performance of the circuit at various voltage values. Based on the timing properties of a particular circuit, and using the representative delays for an initial estimate of voltage, a more accurate estimate of the lowest voltage can be found.

For example, suppose that initially a user circuit with 10 ns timing specification is used, assuming a 1.2 V $V_{DDL}$ value. Suppose that using the final timing model, it is determined that the circuit can operate at 8 ns using the 1.2 V $V_{DDL}$ value. The method then selects another voltage, such as 1.1 V, and uses the final timing model to determine that the circuit can operate with a 9 ns delay. Combining these two determinations and performing a linear extrapolation, one may estimate that 1.0 V is the minimum $V_{DDL}$ voltage for operation. The analysis is then repeated at this voltage iteratively until the minimum voltage is determined to some precision.

The variation described above uses the secant method to determine the minimum value of $V_{DDL}$. One may use other methods to solve for the minimum value of $V_{DDL}$ with sufficient accuracy, as persons of ordinary skill in the art who have the benefit of the description of the invention understand. As an example, one may use binary search. Note that these methods use the final timing model, and at each iteration a new estimate is determined using the predicted performance at some set of $V_{DDL}$ values that have been used in the final timing model.

Figure 16:
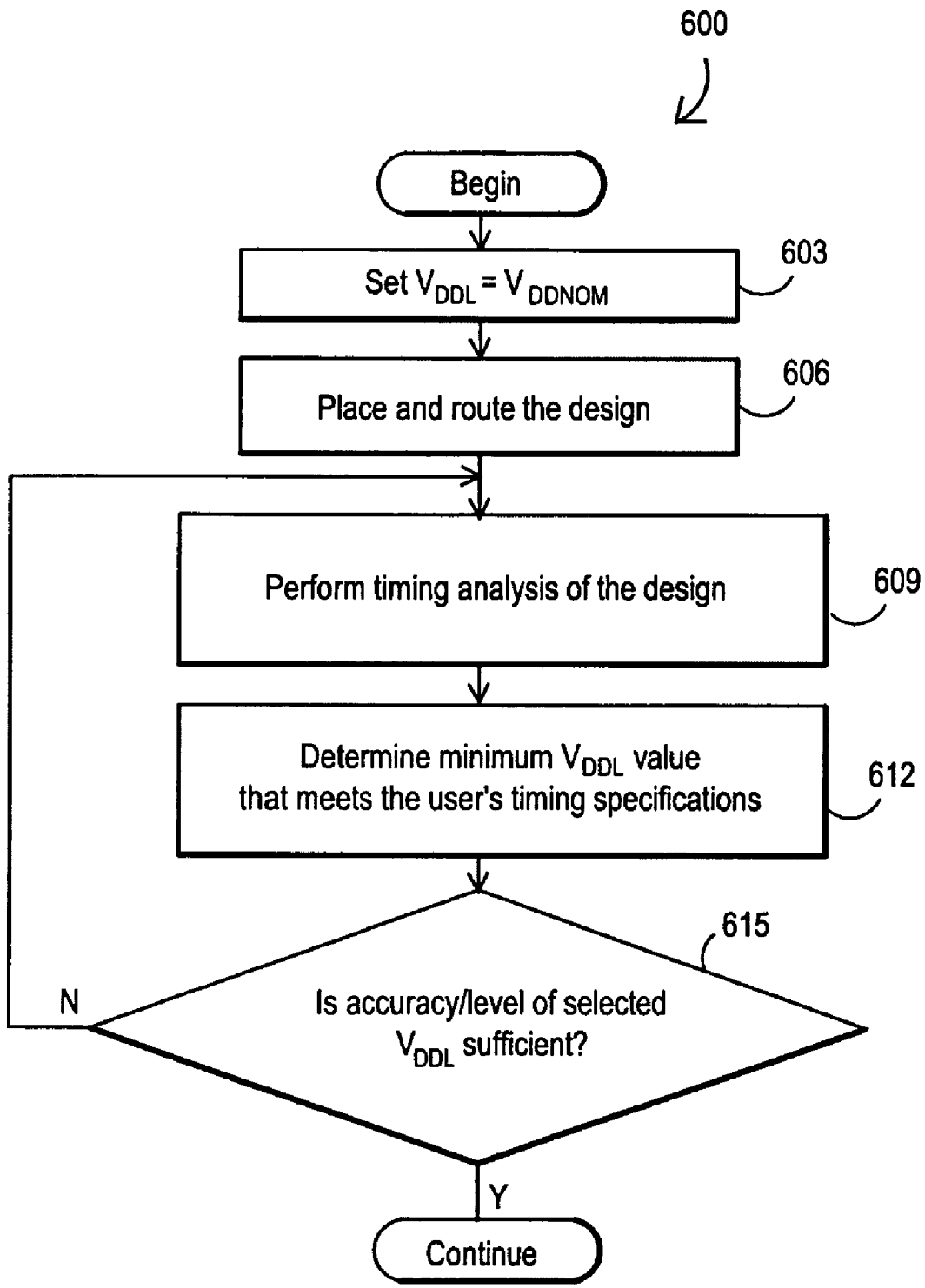
FIG. 16 shows a simplified flow diagram 600 of a method according to an illustrative embodiment of the invention for determining a PLD supply voltage.

FIG. 16 shows a flow diagram 600 that provides a summary of the embodiment above. The method shown uses a single timing model is used to determine the delays through the circuit, and performs one or more iterations to determine the minimum value of $V_{DDL}$.

More specifically, at 603, the method sets $V_{DDL}$ $V_{DDNOM}$ (i.e., assigns $V_{DDNOM}$ to $V_{DDL}$). At 606, place and route of the design is performed. At 609, timing analysis of the design using the current value of $V_{DDL}$ is performed. The timing analysis uses a timing model that includes some dependence of the timing as a function of $V_{DDL}$, as noted above.

At 609, a minimum value of $V_{DDL}$ is determined that meets the user's timing specifications using timing calculations at one or more previous $V_{DDL}$ values. At 612, one determines the minimum value of $V_{DDL}$ that meets the user's timing specifications, using timing at one or more $V_{DDL}$ values used in previous iterations. At 615, a test is made to determine whether the level or accuracy of the estimated $V_{DDL}$ is sufficient to provide performance and the desired level of optimality of power reduction. If the accuracy of the estimated $V_{DDL}$ is insufficient, the method goes back to 609 to select another $V_{DDL}$ value.

Note that, given some known timing of the circuit using the final timing model, it is may be advantageous to estimate a value of $V_{DDL}$ that allows operation so as to meet some specified timing without performing another timing analysis. To do so, it may be desirable to use a separate timing model, the delay sensitivity timing model. The delay sensitivity timing model provides an estimate of the timing of a complete circuit as a function of voltage. The estimate may not be exact, but is used to make estimates of $V_{DDL}$ that can be used properly.

The delay sensitivity model may therefore be less accurate than the final timing model, although it is also possible that the delay sensitivity model be as accurate, or possibly identical to the final timing model. Each such estimate using a less accurate delay sensitivity model should be verified using a final timing model if the delay sensitivity model is not guaranteed to be pessimistic compared to the final timing model. The use of a delay sensitivity model, however, may allow the CAD flow to make a more accurate estimate of a $V_{DDL}$ at each iteration.

As a variation of the method shown in FIG. 16 and described above, one may reduce the number of iterations by including the use of a separate delay sensitivity model. The delay sensitivity model may vary in complexity, but is intended to reflect the performance of an entire circuit as a function of $V_{DDL}$. One simple delay sensitivity model includes using a characteristic table of delay versus voltage that uses a representative mix of the resources of the PLD that occur in a critical path in the user's circuit. One may use the characteristic table to iterate the estimated $V_{DDL}$ value until it is sufficiently close to the minimum value allowable.

In another variation, the timing analysis can determine the timing of the circuit as a function of voltage in a single analysis, using the final timing model. In this case the delay sensitivity model may be as detailed, and identical to the final timing model. In other words, instead of using a delay value that reflects a single delay value at each point of interest in the circuit, the timing is computed at each step in the timing analysis using an explicit model of delay as a function of voltage.

In the most detailed version, this model will be an accurate model of timing as a function of voltage at each timing point in the circuit. The model may be, for example, a piecewise polynomial such as a piecewise linear delay model. At the end of the timing analysis, the timing of the entire circuit is known as a function of voltage, and may then find the minimum supply voltage that meets the required delay value by solving the resulting delay versus voltage function for the specified delay. In this case, the delay sensitivity timing model and the final timing model are the same, as the timing analysis performs the delay sensitivity analysis as part of the timing analysis. Other variations of delay sensitivity models lie between the extremes of a single characteristic table and the use of the final timing model, as desired.

In one version the timing analyzer can include an approximate representation of the sensitivities of multiple circuit paths with respect to voltage. For example, in an architecture where routing delays and logic delays are scaled differently with voltage, the timing analyzer might track the total amount of delay attributable one or more of the different resource types. In general, the timing analyzer can construct a model of delay versus voltage of arbitrary complexity, as desired, and as persons of ordinary skill in the art who have the benefit of the description of the invention understand.

The more detailed approaches above in effect are determining a piecewise linear delay versus voltage curve that contains at most a single breakpoint between two linear sections. An approach that models the delay as being dependent on multiple different resource types with known sensitivities to voltage is equivalent to a piecewise linear approach with a fixed number of breakpoints corresponding to the number of independent sensitivities.

A less detailed approach would consider the maximum delay and the maximum sensitivity at each node, thus reducing the amount of data required. In each approach where the timing analyzer uses a delay sensitivity timing model that is less precise than the final timing model, one may perform iterations using the final timing model to provide an accurate answer. If the delay sensitivity model can be guaranteed to be pessimistic compared to the final timing model, one may not have to perform additional iterations, although doing so would improve the accuracy of the estimated minimum value of $V_{DDL}$. Note that both more and less detailed and time consuming approaches are also possible, but any approach that models delay dependence with respect to voltage, of individual paths or elements, or aggregates of paths or elements, either within the specific user design, or a representation of some collection of designs, is within the scope of the invention.

As a variation of the method in FIG. 16, at 609 one may perform a timing analysis of the circuit, using the current value of $V_{DDL}$, by using a timing model that includes some dependence on timing as a function of $V_{DDL}$, and reports timing with some dependency on $V_{DDL}$. At 612, one determines the minimum value of $V_{DDL}$ that meets the user's timing specifications, using timing as function of voltage computed at 609, to estimate a new value of $V_{DDL}$. (The functions performed at 603 and 606, and the test at 615 may be as described above.)

If timing is computed at each node explicitly as a function of voltage, at the end of the analysis the overall timing of the circuit has been determined across the entire voltage range. The CAD flow can then either select one of the discrete sets of voltages, or perform an interpolation across the finite set of data to determine the minimum supply voltage at which the circuit can operate. Because the functional relationship between delay and voltage may be an approximation in order to make the computation relatively fast and efficient, it may also be desirable to perform the timing analysis again using a more precise timing characteristics at that particular voltage to confirm that the user's timing specifications are met, and possibly to adjust the voltage iteratively in the event that they are not.

Note that the above examples provide mere examples of approaches that compute the delay properties of a circuit that has a voltage dependence. As persons of ordinary skill in the art who have the benefit of the description of the invention understand, one may use other approaches that include this dependence in methods of determining minimum levels of $V_{DDL}$.

To avoid the complexity of the delay analysis of a particular circuit as a function of voltage, the CAD flow may use a simpler representation of the overall behavior of typical circuits, as desired. In another illustrative embodiment, the CAD flow performs a clustering, placement, and routing followed by a single timing analysis using the timing characteristics for the core voltage at the nominal value.

If sufficient margin exists, the CAD flow estimates the minimum voltage allowable by using a tradeoff of timing compared to voltage that has a representation of the delay versus voltage for typical circuits in the PLD. The CAD flow then repeats the timing analysis using timing characteristics determined at this particular core voltage to determine if the user's timing specifications are still met, or whether excess margin exists.

The result of this timing analysis provides a second voltage-timing point for the CAD flow, and can be used to more precisely estimate the core voltage, for example by using a linear interpolation or extrapolation. This process can repeat iteratively, as desired, using progressively more detailed models of the overall circuit voltage-timing tradeoff until the desired tolerance is obtained. The determined core voltage is then output from the CAD flow, either as data to the user, or to be embedded in the programming stream of the PLD, such that it can configure the power supply to deliver that voltage level.

It should be noted that the representation of how delay changes as a function of voltage may be either an average of the behavior of a number of discrete circuits, or may be intentionally designed to be pessimistic to reduce the likelihood that a given particular circuit might have worse delay/voltage properties than the representation, thus causing multiple timing iterations. For example, typical circuits might exhibit 1.5% delay for 1% $V_{DDL}$ variation, but the computation might use a more pessimistic 2% delay for 1% $V_{DDL}$ variation to reduce the probability that any given circuit has higher sensitivity than estimated.

Note that the CAD flows described above perform circuit implementation and optimization (placement and routing) at a fixed $V_{DDL}$ value, and then determine the minimum value of $V_{DDL}$ that meets the circuit timing requirements as a post-processing step. Improved circuit optimization may be achieved by instead considering the most likely $V_{DDL}$ value to be used during circuit optimization algorithms (such as placement and routing), as desired. The following description provides some examples.

Figure 17:
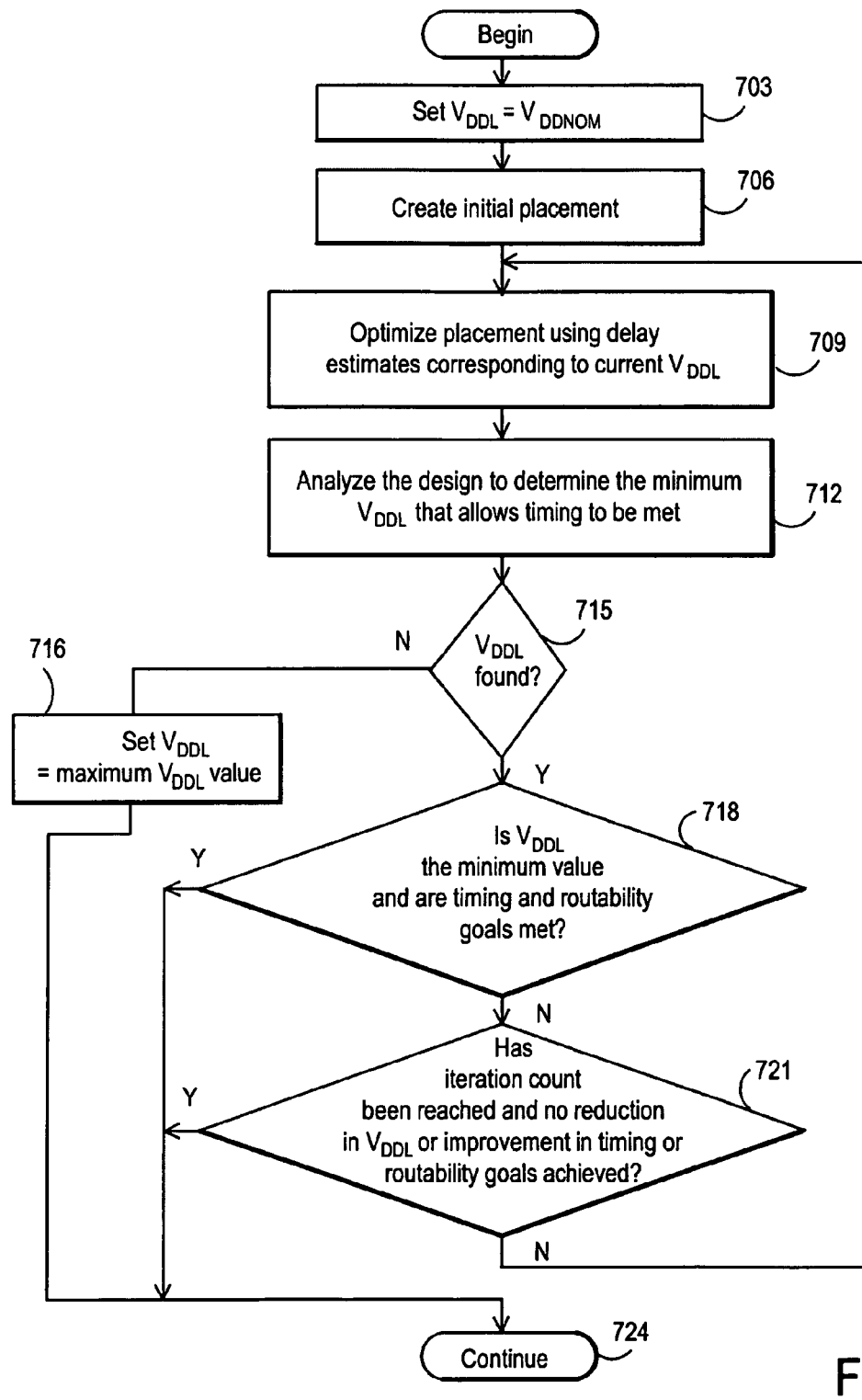
FIG. 17 illustrates a simplified flow diagram 700 for another method according to an illustrative embodiment of the invention for determining a PLD supply voltage.

FIG. 17 shows a simplified flow diagram 700 for a method according to an illustrative embodiment of the invention for determining a PLD supply voltage. The method in FIG. 17 provides for placement optimization that also performs selection of the $V_{DDL}$ supply voltage. At 703, the method sets $V_{DDL}=V_{DDNOM}$ (assigns the value or level of $V_{DDNOM}$ to $V_{DDL}$). At 706, an initial place and route is performed. At 709, placement is optimized using delay estimates corresponding to the current value of $V_{DDL}$.

At 712, the design is analyzed to determine the minimum $V_{DDL}$ that allows timing to be met. The timing analysis may be performed using the method shown in FIG. 16 or variations of it described above, as desired.

At 715, if the $V_{DDL}$ value is found, the method continues to 718; otherwise, at 716, $V_{DDL}$ is set to the maximum value of $V_{DDL}$, and the method continues to 724. A test is made at 718 to determine whether the $V_{DDL}$ value is the minimum $V_{DDL}$ value and whether routability goals are met. If so, the method continues to 724. Otherwise, at 721, a test is made to determine whether an iteration count (for finding $V_{DDL}$) has reached and no reduction in $V_{DDL}$ or improvement in timing or routability goals achieved. If so, the method continues at 724. Otherwise, the method goes back to 709.

Figure 18:
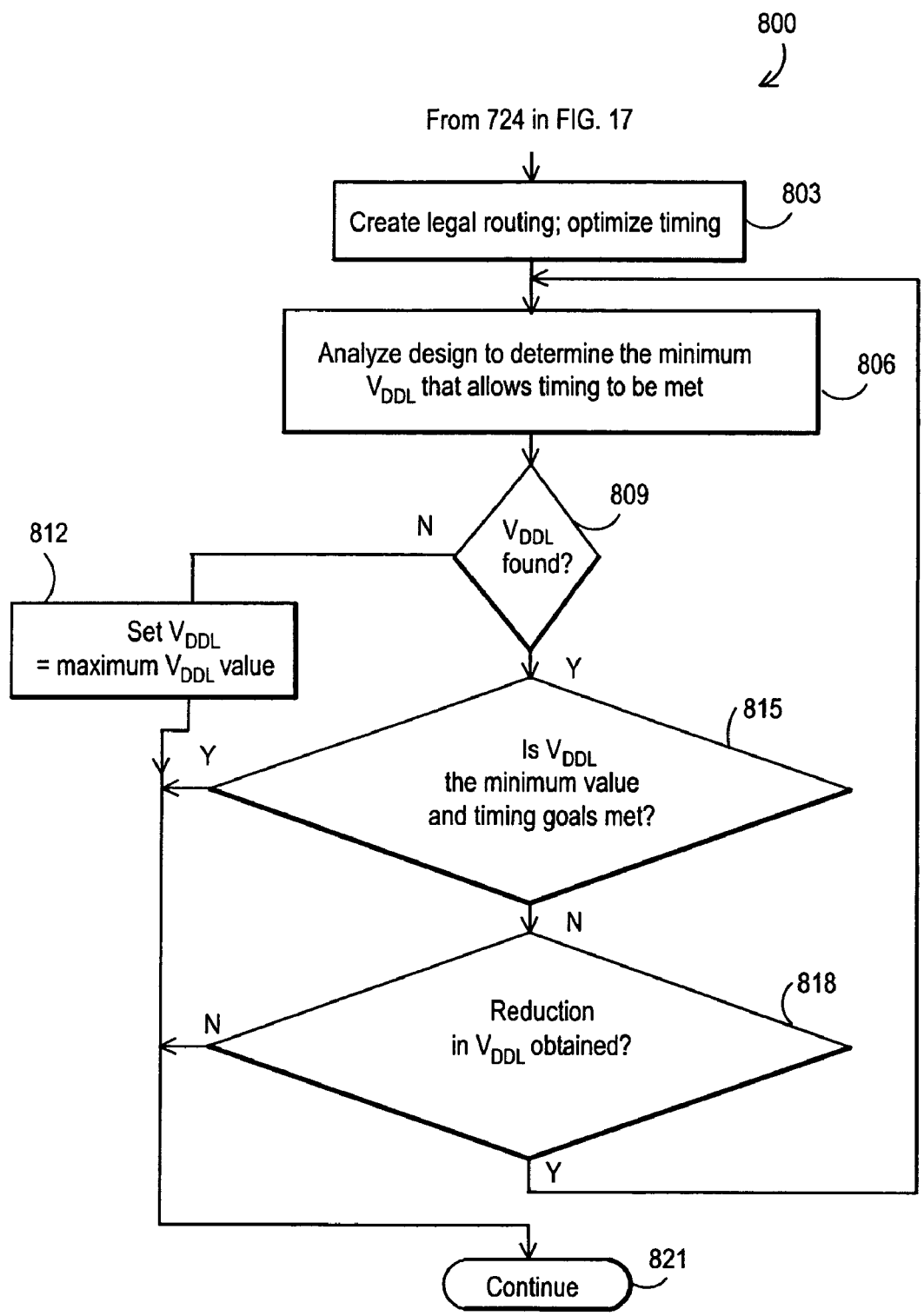
FIG. 18 depicts a simplified flow diagram 800 for yet another method according to the invention for determining a PLD supply voltage.

As another example, FIG. 18 shows a simplified flow diagram 800 for another method according to the invention for determining a PLD supply voltage. The method in FIG. 18 provides for routing optimization that also performs selection of the $V_{DDL}$ supply voltage. The method in FIG. 18 builds up the process shown in FIG. 17, by continuing at 803 from 724 in FIG. 17.

At 803, a legal routing (a routing that conforms to constraints/specifications pertaining to routing resources) is created, and timing is optimized. The timing analysis and optimization may be performed using the method shown in FIG. 16 or variations of it described above, as desired. At 806, the design is analyzed to determine the minimum $V_{DDL}$ that allows timing to be met.

At 809, if the $V_{DDL}$ value is found, the method continues to 815; otherwise, at 812, $V_{DDL}$ is set to the maximum value of $V_{DDL}$, and the method continues to 821. A test is made at 815 to determine whether the $V_{DDL}$ value is the minimum $V_{DDL}$ value and whether timing goals are met. If so, the method continues to 821. Otherwise, at 818, a test is made to determine whether a reduction in $V_{DDL}$ is obtained. If not, the method continues to 821. Otherwise, the method goes back to 806.

Note that the level of $V_{DDH}$ is set separately from the processes described, or as part of the CAD flow that includes the above processes, as desired. As another alternative, the user may provide the level of the $V_{DDH}$ supply, as desired. The user may do so based on his/her preferences or based on data provided by the CAD flow, as desired.

Note that one may apply the inventive concepts effectively to various programmable ICs that include programmable or configurable logic circuitry, known by other names in the art, as desired, and as persons skilled in the art with the benefit of the description of the invention understand. Such circuitry include, for example, devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand. Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

The invention claimed is:

1. A computer-aided method of implementing an electronic circuit by using resources within a programmable logic device (PLD), wherein the PLD is powered by first and second supply voltages, the method comprising:
   (a1) assigning, using the computer, a preset level to the first supply voltage, and assigning a nominal level to the second supply voltage;
   (b1) performing, using the computer, place and route of the resources within the PLD used to implement the electronic circuit; and
   (c1) determining, using the computer, a value of the second supply voltage level that meets a timing specification of the electronic circuit.

2. The method according to claim 1, wherein determining a value of the second supply voltage level that meets a timing specification of the electronic circuit further comprises determining, using the computer, a minimum value of the second supply voltage level that meets a timing specification of the electronic circuit.

3. The method according to claim 2, wherein determining a value of the second supply voltage level that meets a timing specification of the electronic circuit further comprises:
   determining, using the computer, whether the selected second supply level is sufficient to provide a desired level of performance; and
   going to (b1) if the selected second supply level is insufficient to provide the desired level of performance.

4. The method according to claim 2, wherein determining a minimum value of the second supply voltage level that meets a timing specification of the electronic circuit further comprises using a timing model with dependency on the second supply voltage value.

5. The method according to claim 4, wherein determining a minimum value of the second supply voltage level that meets a timing specification of the electronic circuit further comprises using timing computed as a function of voltage to estimate a new value for the second supply voltage level.

6. A computer-aided method of implementing an electronic circuit using resources within a programmable logic device (PLD), wherein the PLD is powered by first and second supply voltages, the method comprising:
   (a2) assigning, using the computer, a preset level to the first supply voltage, and assigning a nominal level to the second supply voltage;
   (b2) performing, using the computer, a placement of the resources within the PLD;
   (c2) optimizing, using the computer, the placement by using delay estimates corresponding to the second supply voltage level; and
   (d2) determining, using the computer, a value of the second supply voltage level that meets a timing specification of the electronic circuit.

7. The method according to claim 6, wherein determining a value of the second supply voltage level that meets a timing specification of the electronic circuit further comprises determining, using the computer, a minimum value of the second supply voltage level that meets a timing specification of the electronic circuit.

8. The method according to claim 7, wherein determining a value of the second supply voltage level that meets a timing specification of the electronic circuit further comprises:
   assigning, using the computer, to the second supply voltage a maximum level depending on successfully determining a value of the second supply voltage level that meets a timing specification of the electronic circuit; and
   determining, using the computer, whether timing and routability goals are met at the second supply voltage level.

9. The method according to claim 8, further comprising:
   creating, using the computer, a routing that meets a set of routing specifications;
   optimizing, using the computer, timing of the electronic circuit; and
   analyzing, using the computer, the electronic circuit to determine the minimum second supply voltage value that allows meeting a set of timing specifications.

* * * * *